(12) United States Patent
Wang

(10) Patent No.: US 12,098,737 B2
(45) Date of Patent: Sep. 24, 2024

(54) JOINT STRUCTURE, JOINT MODULE AND METHOD OF ASSEMBLING JOINT STRUCTURE ON OBJECT

(71) Applicant: FIVETECH TECHNOLOGY INC., New Taipei (TW)

(72) Inventor: Ting-Jui Wang, New Taipei (TW)

(73) Assignee: FIVETECH TECHNOLOGY INC., New Taipei (TW)

( * ) Notice: Subject to any disclaimer, the term of this patent is extended or adjusted under 35 U.S.C. 154(b) by 180 days.

(21) Appl. No.: 17/492,702

(22) Filed: Oct. 4, 2021

(65) Prior Publication Data

US 2022/0128073 A1    Apr. 28, 2022

(30) Foreign Application Priority Data

Oct. 23, 2020 (TW) ................................. 109136979
Feb. 2, 2021 (TW) ................................. 110103873

(51) Int. Cl.
*F16B 2/02* (2006.01)
*F16B 5/02* (2006.01)
*F16B 5/06* (2006.01)

(52) U.S. Cl.
CPC .............. *F16B 2/02* (2013.01); *F16B 5/0208* (2013.01); *F16B 5/0266* (2013.01); *F16B 2005/0678* (2013.01)

(58) Field of Classification Search
CPC .... F16B 5/0032; F16B 5/0036; F16B 5/0084; F16B 5/0088; F16B 5/0208; F16B 5/0266; F16B 5/0621; F16B 5/0642; F16B 2005/0678; Y10S 403/04; Y10T 403/16; Y10T 403/1608; Y10T 403/1616; Y10T 403/1624; Y10T 403/3941; Y10T 403/4634; Y10T 403/49; Y10T 403/4966; Y10T 403/75
USPC ....... 403/11, 12, 13, 14, 193, 242, 274, 282, 403/408.1, DIG. 4
See application file for complete search history.

(56) References Cited

U.S. PATENT DOCUMENTS 3,179,457 A * 4/1965 Johnson ................. F16B 21/04
                                                          292/195
3,180,389 A * 4/1965 Charles ................. F16B 5/0208
                                                          411/968
7,990,722 B2 * 8/2011 Cao ..................... H01L 23/4006
                                                          165/185

(Continued)

FOREIGN PATENT DOCUMENTS

CN          205446322 U       8/2016
CN          108075328 A       5/2018

(Continued)

*Primary Examiner* — Josh Skroupa

(57) ABSTRACT

A joint structure, a joint module and a method of assembling a joint structure on an object. The joint structure includes a body part and an actuating piece. The actuating piece combines movably with the body part, the actuating piece has a first joint part, the first joint part is located outside of the body part, the first joint part can carry out a vertical movement, lateral movement or rotational movement. Accordingly, the body part of the disclosure can go with the actuating piece or the first joint part, and combine to the first object and the second object, or disengage from the first object and the second object for achieving the effect of combining or separating at least two objects.

14 Claims, 29 Drawing Sheets

(56) References Cited

U.S. PATENT DOCUMENTS

| | | | | |
|---|---|---|---|---|
| 9,091,293 B1* | 7/2015 | Tseng | ............... | F16B 5/0208 |
| 9,441,653 B2* | 9/2016 | Wang | ............... | F16B 5/0208 |
| 10,054,142 B2* | 8/2018 | Bachman | ............... | F16B 5/0208 |
| 10,132,345 B2* | 11/2018 | Wu | ............... | F16B 21/02 |
| 10,294,971 B2* | 5/2019 | Wu | ............... | F16B 5/0642 |
| 10,954,983 B2* | 3/2021 | Carper | ............... | F16B 21/02 |
| 2005/0129461 A1* | 6/2005 | Bruno | ............... | F16B 5/0208 |
| | | | | 403/408.1 |
| 2013/0183086 A1* | 7/2013 | Wang | ............... | F16B 5/0642 |
| | | | | 403/327 |
| 2014/0093326 A1* | 4/2014 | Wang | ............... | F16B 5/0208 |
| | | | | 411/103 |
| 2014/0105707 A1* | 4/2014 | Tseng | ............... | F16B 21/04 |
| | | | | 411/508 |
| 2017/0146050 A1* | 5/2017 | Wang | ............... | F16B 5/0208 |
| 2018/0023649 A1* | 1/2018 | Wang | ............... | B65D 85/30 |
| | | | | 206/521 |

FOREIGN PATENT DOCUMENTS

| | | | | |
|---|---|---|---|---|
| CN | 113513523 A | | 10/2021 | |
| GB | 892561 A | * | 3/1962 | ............ F16B 5/0208 |
| TW | M402972 U | | 5/2011 | |
| TW | I591268 B | | 7/2017 | |
| TW | I674365 B | | 10/2019 | |
| TW | M612970 U | | 6/2021 | |
| WO | WO-2017136670 A1 | * | 8/2017 | ............ F16B 5/0208 |

\* cited by examiner

121(126)

(a) (b) (c) (d) (e)

JOINT STRUCTURE, JOINT MODULE AND METHOD OF ASSEMBLING JOINT STRUCTURE ON OBJECT

CROSS-REFERENCE TO RELATED APPLICATION

This non-provisional application claims priority under 35 U.S.C. § 119(a) on Patent Application No(s). 109136979 filed in Taiwan, R.O.C. on Oct. 23, 2020 and Patent Application No(s). 110103873 filed in Taiwan, R.O.C. on Feb. 2, 2021, the entire contents of which are hereby incorporated by reference.

BACKGROUND OF THE INVENTION

1. Field of the Invention

The present disclosure relates to a joint structure, a joint module and a method of assembling a joint structure on an object, and in particular to a joint structure, a joint module and a method of assembling a joint structure on an object which can achieve the effect of combining or separating at least two objects.

2. Description of the Related Art

Generally, when at least two first objects are combined, they are usually locked with screws or fasteners as a combination of the first objects.

Although the above method can combine two first objects, they fail to be moved or separated after the combination, so that the screws or fasteners cannot meet the requirement of practical application relatively.

BRIEF SUMMARY OF THE INVENTION

In view of the shortcomings of the above-mentioned prior art, the inventor researched and developed a joint structure, a joint module and a method of assembling a joint structure on an object. It is expected to combine to the first object and the second object, or disengage from the first object and the second object for achieving the effect of combining or separating at least two objects.

To achieve the above objective and other objectives, the present disclosure provides a joint structure, comprising: a body part and an actuating piece. The actuating piece combines movably with the body part, the actuating piece has a first joint part, the first joint part is located outside of the body part, the first joint part can carry out a vertical movement, lateral movement or rotational movement.

The disclosure further provides a joint structure, comprising: a body part and an actuating piece. The actuating piece has a first joint part and a rod part, the rod part combines movably inside the body part, so that the actuating piece combines movably with the body part, the first joint part is located outside of the body part, the first joint part can carry out a vertical movement, lateral movement or rotational movement.

The disclosure further provides a joint structure, comprising: a body part and an actuating piece. The actuating piece has a first joint part, a rod part, a stop part and an elastic element, the rod part combines movably inside the body part, so that the actuating piece combines movably with the body part, the first joint part is located outside of the body part, one end of the elastic element abuts against the body part, and the other end of the elastic element abuts against the stop part, the first joint part can carry out a vertical movement, lateral movement or rotational movement.

The disclosure further provides a joint structure, comprising: a body part and an actuating piece. The actuating piece has a first joint part, a rod part and a second joint part, the rod part combines movably inside the body part, so that the actuating piece combines movably with the body part, the first joint part is located outside of the body part, the second joint part can carry out a vertical movement, lateral movement or rotational movement.

The disclosure further provides a joint structure, comprising: a body part and an actuating piece. The actuating piece has a first joint part, a rod part, an elastic element and a second joint part, the rod part combines movably inside the body part, so that the actuating piece combines movably with the body part, the first joint part is located outside of the body part, one end of the elastic element abuts against the body part, and the other end of the elastic element abuts against the second joint part, the second joint part can carry out a vertical movement, lateral movement or rotational movement.

The disclosure further provides a joint structure, comprising: a body part and an actuating piece. The actuating piece combines movably with the body part, the actuating piece has a second joint part, the second joint part is located inside or outside of the body part, the second joint part can carry out a vertical movement, lateral movement or rotational movement.

The disclosure further provides a joint structure, comprising: a body part and an actuating piece. The actuating piece has a second joint part and a rod part, the rod part combines movably inside the body part, so that the actuating piece combines movably with the body part, the second joint part is located inside or outside of the body part, the second joint part can carry out a vertical movement, lateral movement or rotational movement.

The disclosure further provides a joint structure, comprising: a body part and an actuating piece. The actuating piece has a second joint part, a rod part, a stop part and an elastic element, the rod part combines movably inside the body part, so that the actuating piece combines movably with the body part, the second joint part is located inside or outside of the body part, one end of the elastic element abuts against the body part, and the other end of the elastic element abuts against the stop part, the second joint part can carry out a vertical movement, lateral movement or rotational movement.

The disclosure further provides a method of assembling a joint structure, which allows a part of the actuating piece to combine movably with the body part, in order to make the first joint part of the actuating piece located outside of the body part, so that the first joint part can carry out a vertical movement, lateral movement or rotational movement.

The disclosure further provides a method of assembling a joint structure on an object, comprising the following steps: providing a pick-up tool to pick up the joint structure; using the pick-up tool to move the joint structure to an assembly position of the object; allowing the joint structure to fall to the assembly position of the object.

The disclosure further provides a method of assembling a joint structure on an object, comprising the following steps: providing a pick-up tool to pick up the joint structure; using the pick-up tool to move the joint structure to an assembly position of the object; loosening or releasing the joint structure from the pick-up tool to make the joint structure assemble to the assembly position of the object.

The disclosure further provides a method of assembling a joint structure on an object, comprising the following steps: providing a pick-up tool to pick up the joint structure; using the pick-up tool to move the joint structure to an assembly position of the object; pressing down the joint structure on the object by the pick-up tool, in order to place the joint structure on the assembly position of the object.

The disclosure further provides a method of assembling a joint structure on an object, comprising the following steps: providing a pick-up tool to pick up the joint structure; using the pick-up tool to move the joint structure to an assembly position of the object; and elastically pressing down the joint structure on the object by the pick-up tool, in order to place the joint structure on the assembly position of the object.

In the joint structure, a joint module and a method of assembling a joint structure on an object, an elastic element is further comprised, one end of the elastic element abuts against the body part, and the other end of the elastic element abuts against the actuating piece in the body part, or one end of the elastic element abuts against the body part, and the other end of the elastic element abuts against the rod part in the body part, or one end of the elastic element abuts against the body part, and the other end of the elastic element abuts against the second joint part in the body part.

In the joint structure, a joint module and a method of assembling a joint structure on an object, the body part has an assembling part, the assembling part is used to assemble to the first object.

In the joint structure, a joint module and a method of assembling a joint structure on an object, the assembling part has an accommodating part, the body part is pressed by an external force and squeezed into the first object, so that the material of the first object enters the accommodating part, in order to carry out the assembly of the assembling part and the first object.

In the joint structure, a joint module and a method of assembling a joint structure on an object, the assembling part has an expansion part, so that the expansion part is pressed by an external force to be deformed and expanded, and is assembled with the first object.

In the joint structure, a joint module and a method of assembling a joint structure on an object, the joint structure is picked up by a pick-up tool, and placed at an assembly position of the first object after a distance or position is matched by a matching device.

In the joint structure, a joint module and a method of assembling a joint structure on an object, a surface of the body part has a solderable layer, the solderable layer of the body part is used to be soldered to a solderable layer of the first object.

In the joint structure, a joint module and a method of assembling a joint structure on an object, the body part has a solderable layer, the body part is heated to be soldered to a solderable layer of the first object, and the first object is a PCB.

In the joint structure, a joint module and a method of assembling a joint structure on an object, the solderable layer of the body part is a tin or nickel layer, and has a copper layer in the tin or nickel layer.

In the joint structure, a joint module and a method of assembling a joint structure on an object, the solderable layer of the first object is a preset tin layer on the copper layer.

In the joint structure, a joint module and a method of assembling a joint structure on an object, the first joint part or the second joint part has a turning part, the turning part combines with the rod part by a bolt connection.

In the joint structure, a joint module and a method of assembling a joint structure on an object, the turning part is turned to drive the first joint part turning, and make the rod part move up and down.

In the joint structure, a joint module and a method of assembling a joint structure on an object, the lateral width and vertical width of the turning part is different, when it is turning, the rod part moves with a different distance.

In the joint structure, a joint module and a method of assembling a joint structure on an object, the lateral width and vertical width of the turning part is the same, when it is turning, the rod part moves with the same distance.

In the joint structure, a joint module and a method of assembling a joint structure on an object, when the turning part is turned, the second joint part is driven to move.

In the joint structure, a joint module and a method of assembling a joint structure on an object, the first joint part and the second joint part may simultaneously carry out fastening and simultaneously carry out unfastening.

In the joint structure, a joint module and a method of assembling a joint structure on an object, the first joint part and the second joint part may carry out fastening respectively and carry out unfastening respectively.

In the joint structure, a joint module and a method of assembling a joint structure on an object, the quantity of the first joint part is one, two or more.

In the joint structure, a joint module and a method of assembling a joint structure on an object, the first joint part may pass through a fastening into part of a first object and vertically fastened into a second object.

In the joint structure, a joint module and a method of assembling a joint structure on an object, the first joint part may carry out a vertical fastening, lateral fastening or rotational fastening.

In the joint structure, a joint module and a method of assembling a joint structure on an object, the elastic element normally abuts against the body part and the actuating piece, so that the first joint part of the actuating piece, the stop part or the second joint part is normally pushed by the elastic force, and applies a reciprocating elastic force downwards.

In the joint structure, a joint module and a method of assembling a joint structure on an object, the first joint part is a heat dissipating element, it can be moved upwards and then pressed downwards to a hot electronic element, to assist in heat dissipation or to assist a stable signal transmission of the hot electronic element.

In the joint structure, a joint module and a method of assembling a joint structure on an object, a heat dissipating element is placed between the actuating piece and the hot electronic element after the first joint part is moved upwards to assist in heat dissipation.

In the joint structure, a joint module and a method of assembling a joint structure on an object, the heat dissipating element is a heat dissipating sheet, radiator, heat dissipating paste or heat dissipating solution.

In the joint structure, a joint module and a method of assembling a joint structure on an object, the first joint part may be stacked with a heat dissipating element or a heat dissipating substance thereon.

In the joint structure, a joint module and a method of assembling a joint structure on an object, the first joint part has a position limiting structure, which is used to limit the position of a heat dissipating element, a heat dissipating substance or a hot electronic element.

In the joint structure, a joint module and a method of assembling a joint structure on an object, there is a floating limit part between the actuating piece and the body part, the floating limit part limits a floating amount of the body part to make the body part placed in an assembly position of the first object.

In the joint structure, a joint module and a method of assembling a joint structure on an object, the actuating piece has a passing part, the first joint part may be pressed downwards to make a heat dissipating element set in the passing part.

In the joint structure, a joint module and a method of assembling a joint structure on an object, the rod part of the actuating piece is an expansion structure, riveting structure or locking structure, and combined to a setting part of the actuating piece, or the actuating piece is integrally formed with the rod part.

In the joint structure, a joint module and a method of assembling a joint structure on an object, the first joint part is equipped with a heat dissipating element or a cooling device, or the first joint part is a heat dissipating element or a cooling device, the heat dissipating element or the cooling device is used to assist in cooling or heat dissipation of an electronic element.

In the joint structure, a joint module and a method of assembling a joint structure on an object, the actuating piece is a turning body, so that the actuating piece is turned to lift the bolted rod part, and then connected to a third object, and the actuating piece is pressed downwards to join to a heat dissipating element or a hot electronic element.

In the joint structure, a joint module and a method of assembling a joint structure on an object, the actuating piece has an assembling part, the assembling part is assembled to an assembling part of the third object.

In the joint structure, a joint module and a method of assembling a joint structure on an object, the joint structure is assembled to a retaining body to make the first joint part fastened into an object, so that a position of the object is limited to the retaining body, or the first joint part is moved upwards to disengage from the object, so that the body is disengaged from the retaining body.

In the joint structure, a joint module and a method of assembling a joint structure on an object, the body part has an anti-rotation part, the actuating piece has a corresponding anti-rotation part, the anti-rotation part and the corresponding anti-rotation part are anti-rotational mutually, and the corresponding anti-rotation part can be disengaged from the anti-rotation part, the actuating piece is turned to a bearing part of the body part to make the actuating piece stay or temporarily stay at the bearing part.

In the joint structure, a joint module and a method of assembling a joint structure on an object, the body part has an anti-rotation part, the actuating piece has a corresponding anti-rotation part, the anti-rotation part and the corresponding anti-rotation part are anti-rotational mutually, and the corresponding anti-rotation part can be lifted upwards to disengage from the anti-rotation part, the actuating piece is turned to a bearing part of the body part to make the actuating piece stay or temporarily stay at the bearing part.

In the joint structure, a joint module and a method of assembling a joint structure on an object, the anti-rotation part is a cut side, split side, split groove, cut groove, concave part, convex part or step part.

In the joint structure, a joint module and a method of assembling a joint structure on an object, the following steps are further comprised: after the joint structure is picked up by the pick-up tool, a matching device is provided to match an assembly position or an assembly distance of the joint structure to the object; the pick-up tool is used to assemble the joint structure to the assembly position of the object according to matching information of the matching device.

In the joint structure, a joint module and a method of assembling a joint structure on an object, the following steps are further comprised: after the joint structure is picked up by the pick-up tool, a matching device is provided to match a position or distance of the joint structure to a solderable layer on an assembly position of the object; the pick-up tool is used to move the joint structure to the solderable layer of the object according to matching information of the matching device to make the joint structure assemble to the solderable layer of the object.

In the joint structure, a joint module and a method of assembling a joint structure on an object, the following steps are further comprised: after the joint structure is picked up by the pick-up tool, a matching device is provided to match an assembly position or an assembly distance of the joint structure to the object; the pick-up tool is used to move the joint structure to a preset height over the assembly position of the object according to matching information of the matching device; the joint structure is loosened or released from the pick-up tool to make the joint structure assemble to the assembly position of the object.

In the joint structure, a joint module and a method of assembling a joint structure on an object, the following steps are further comprised: after the joint structure is picked up by the pick-up tool, a matching device is provided to match a position or distance of the joint structure to a solderable layer on an assembly position of the object; the pick-up tool is used to move the joint structure to a preset height over the solderable layer of the object according to matching information of the matching device; the joint structure is loosened or released from the pick-up tool to make the joint structure assemble to the solderable layer of the object.

In the joint structure, a joint module and a method of assembling a joint structure on an object, the first joint part or the second joint part is a column, rod body, fastening body, thread body, protrusion fastening body, inner fastening body or elastically fastening body.

In the joint structure, a joint module and a method of assembling a joint structure on an object, the first joint part has a fastening part, and the fastening part is combined fixedly with the first joint part.

In the joint structure, a joint module and a method of assembling a joint structure on an object, the fastening part is made of metallic material or plastic material, the first joint part is made of plastic material or metallic material.

In the joint structure, a joint module and a method of assembling a joint structure on an object, the first joint part is made of plastic material or metallic material.

In the joint structure, a joint module and a method of assembling a joint structure on an object, the following steps are further comprised: after the joint structure is picked up by the pick-up tool, a matching device is provided to match an assembly position or an assembly distance of the joint structure to the object; the pick-up tool is used to assemble the joint structure to the assembly position of the object according to matching information of the matching device; and pressing down the joint structure on the object by the pick-up tool, in order to place the joint structure on the assembly position of the object.

In the joint structure, a joint module and a method of assembling a joint structure on an object, the following steps are further comprised: after the joint structure is picked up by the pick-up tool, a matching device is provided to match a position or distance of the joint structure to a solderable layer on an assembly position of the object; the pick-up tool is used to move the joint structure to the solderable layer of the object according to matching information of the matching device; and pressing down the joint structure on the object by the pick-up tool, in order to place the joint structure on the assembly position of the object.

In the joint structure, a joint module and a method of assembling a joint structure on an object, the following steps are further comprised: after the joint structure is picked up by the pick-up tool, a matching device is provided to match an assembly position or an assembly distance of the joint structure to the object; the pick-up tool is used to assemble the joint structure to the assembly position of the object according to matching information of the matching device; and elastically pressing down the joint structure on the object by the pick-up tool, in order to place the joint structure on the assembly position of the object.

In the joint structure, a joint module and a method of assembling a joint structure on an object, the following steps are further comprised: after the joint structure is picked up by the pick-up tool, a matching device is provided to match a position or distance of the joint structure to a solderable layer on an assembly position of the object; the pick-up tool is used to move the joint structure to the solderable layer of the object according to matching information of the matching device; and elastically pressing down the joint structure on the object by the pick-up tool, in order to place the joint structure on the assembly position of the object.

In the joint structure, a joint module and a method of assembling a joint structure on an object, the actuating piece has a pressed part, the pressed part combines with the rod part, the pressed part combines movably the rod part, or the pressed part is integrally formed with the rod part.

In the joint structure, a joint module and a method of assembling a joint structure on an object, the pressed part is combined with the rod part by a riveted connection.

In the joint structure, a joint module and a method of assembling a joint structure on an object, the pressed part is combined with the rod part by an expansion connection.

In the joint structure, a joint module and a method of assembling a joint structure on an object, a method of assembling the pressed part is that the pressed part is first combined with the first joint part formed by plastic injection molding in a mold, and then combined with the rod part by a riveted connection or an expansion connection.

In the joint structure, a joint module and a method of assembling a joint structure on an object, a method of assembling the pressed part is that the first joint part or the second joint part is first formed by plastic injection molding in a mold, and then the position of the first joint part or the second joint part is limited between the pressed part and the body part, and combined with the rod part.

In the joint structure, a joint module and a method of assembling a joint structure on an object, the first joint part or the second joint part is injected or plastic injected out of the mold, allowing the liquid material or liquid plastic material to enter the mold from a flow channel, after it is cooled down, the first joint part or the second joint part is formed.

In the joint structure, a joint module and a method of assembling a joint structure on an object, the pressed part and the body part are made of metallic material, used to bear an external force putting pressure on the pressed part and the body part for combining with a first object by a riveted connection or an expansion connection.

In the joint structure, a joint module and a method of assembling a joint structure on an object, the pressed part is higher than the surface of the first joint part, in order to make the pressed part first bear the external force putting pressure when the external force is used to put pressure.

In the joint structure, a joint module and a method of assembling a joint structure on an object, the first joint part or the second joint part has a fastening part, the fastening part is made of metallic material, the first joint part or the second joint part is made of plastic material, and the first joint part or the second joint part is combined with the fastening part by plastic buried in the mold injection, a riveting connection, expansion connection or snap connection.

In the joint structure, a joint module and a method of assembling a joint structure on an object, the first joint part or the second joint part has a fastening part, the fastening part is made of metallic material, the first joint part or the second joint part is in the mold, allowing the liquid plastic material to enter a chamber of the mold from the flow channel, after it is cooled down, the first joint part or the second joint part is combined with the fastening part.

In the joint structure, a joint module and a method of assembling a joint structure on an object, the joint structure is assembled to a retaining body to make the first joint part or the second joint part fastened into an object, so that a position of the object is limited to the retaining body, or the first joint part or the second joint part can be moved upwards to disengage from the object, so that the object is disengaged from the retaining body.

In the joint structure, a joint module and a method of assembling a joint structure on an object, the joint structure is assembled to a first object, or the body part is integrally formed with the first object, wherein the first object is a chassis, computer case, case body, motherboard, track, PCB, computer, memory, metallic piece or plastic piece, or the joint structure is assembled to a retaining body to make the first joint part or the second joint part fastened into an object, so that the position of the object is limited to the retaining body, or the first joint part or the second joint part is moved upwards to disengage from the object, and thus the object is disengaged from the retaining body, wherein the retaining body is a chassis, computer case, case body, motherboard, track, PCB, computer, memory, metallic piece or plastic piece.

Accordingly, the joint structure, a joint module and a method of assembling a joint structure on an object of the present disclosure can allow the body part of the disclosure to go with the actuating piece or the first joint part, and combine to the first object and the second object, or disengage from the first object and the second object for achieving the purpose of combining or separating at least two objects.

DETAILED DESCRIPTION OF THE INVENTION

To facilitate understanding of the object, characteristics and effects of this present disclosure, embodiments together with the attached drawings for the detailed description of the present disclosure are provided.

Figure 1:
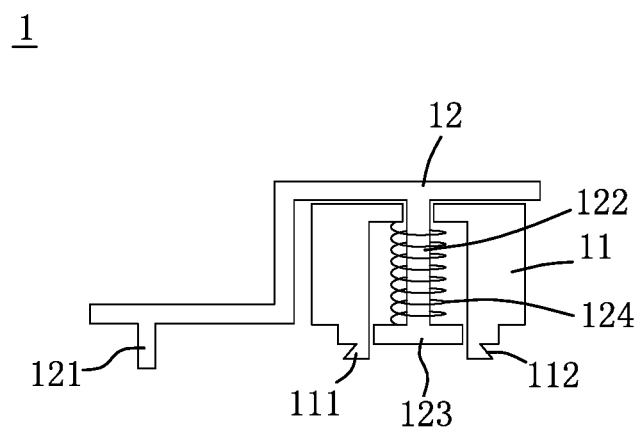
FIG. 1 is a schematic view of a joint structure according to the first embodiment of the present disclosure.
Figure 2:
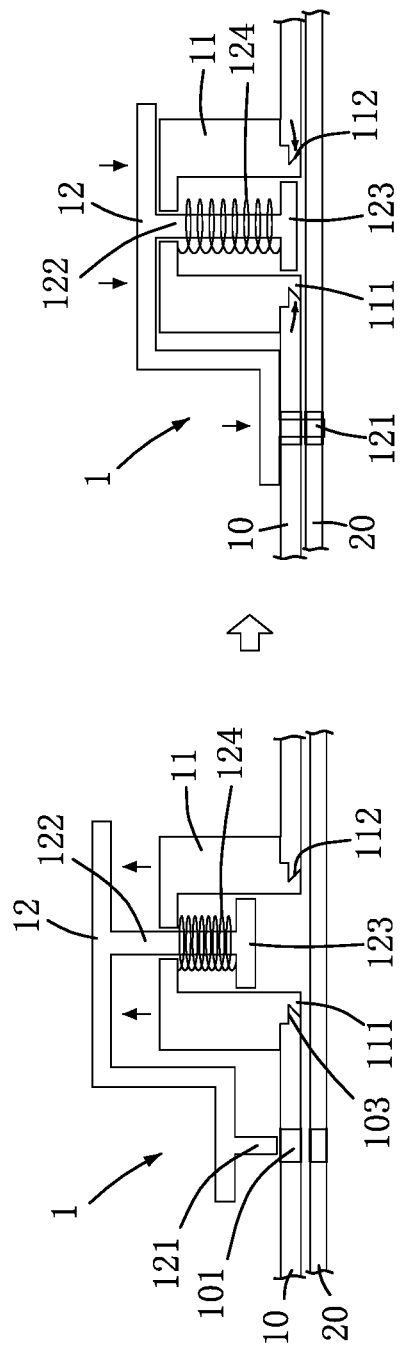
FIG. 2 is a schematic view of state of use of the joint structure according to the first embodiment of the present disclosure.

Referring to FIG. 1 and FIG. 2, as shown in the drawings, the disclosure provides a joint structure, a joint module and a method of assembling a joint structure on an object, and the joint structure 1 comprises a body part 11 and an actuating piece 12.

The actuating piece 12 combines movably with the body part 11, the actuating piece 12 has a first joint part 121, the first joint part 121 is located outside of the body part 11, the first joint part 121 can carry out a vertical movement, lateral movement or rotational movement.

In an embodiment of the joint structure 1 of the present disclosure, the actuating piece 12 may further comprise a rod part 122, the rod part 122 combines movably inside the body part 11, so that the actuating piece 12 combines movably with the body part 11.

In an embodiment of the joint structure 1 of the present disclosure, the actuating piece 12 may further comprise a stop part 123 and an elastic element 124, one end of the elastic element 124 abuts against the body part 11, and the other end of the elastic element 124 abuts against the stop part 123; wherein the elastic element 124 normally abuts against the body part 11 and the stop part 123 of the actuating piece 12, so that the first joint part 121 of the actuating piece 12 and the stop part 123 are normally pushed by the elastic force, and applies a reciprocating elastic force downwards.

The disclosure further provides a method of assembling the joint structure, and when the joint structure 1 of the present disclosure is assembled, a part of the actuating piece (e.g., the rod part 122 and the stop 123) may be combined movably with the body part 11, so that the first joint part 121 of the actuating piece 12 is located outside of the body part 11, and thus the first joint part 121 can carry out a vertical movement, lateral movement or rotational movement.

In an embodiment of the disclosure, the body part 11 has an assembling part 111, the assembling part 111 has an accommodating part 112. A first object 10 has a fastening into part 101 and an assembled part 103, the assembling part 111 of the body part 11 is pressed by an external force and squeezed into the assembled part 103 of the first object 10, so that the material of the first object 10 enters the accommodating part 112, in order to carry out the assembly of the assembling part 111 and the first object 10. The fastening into part 101 and the assembled part 103 of the first object 10 are located at different positions (as shown in FIG. 2).

When the joint structure is used, the actuating piece 12 can be pulled to make the actuating piece 12 move upwards and compress the elastic element 124, after a second object 20 that is to be fastened is set, the actuating piece 12 can be released, so that the actuating piece 12 moves downwards due to the release of the elastic force of the elastic element 124, thus allowing the first joint part 121 to pass through the fastening into part 101 of the first object 10 and vertically fastened into the second object 20. When the second object 20 is to be separated, the actuating piece 12 can be pulled to make the actuating piece 12 move upwards and compress the elastic element 124, thus allowing the first joint part 121 to disengage from the second object 20 (or leave the fastening into part 101 at the same time) to separate the second object 20. Accordingly, the joint structure 1 may be combined with the first object 10 and the second object 20, in order to complete the purpose of combination or separation of at least two objects.

Figure 3:
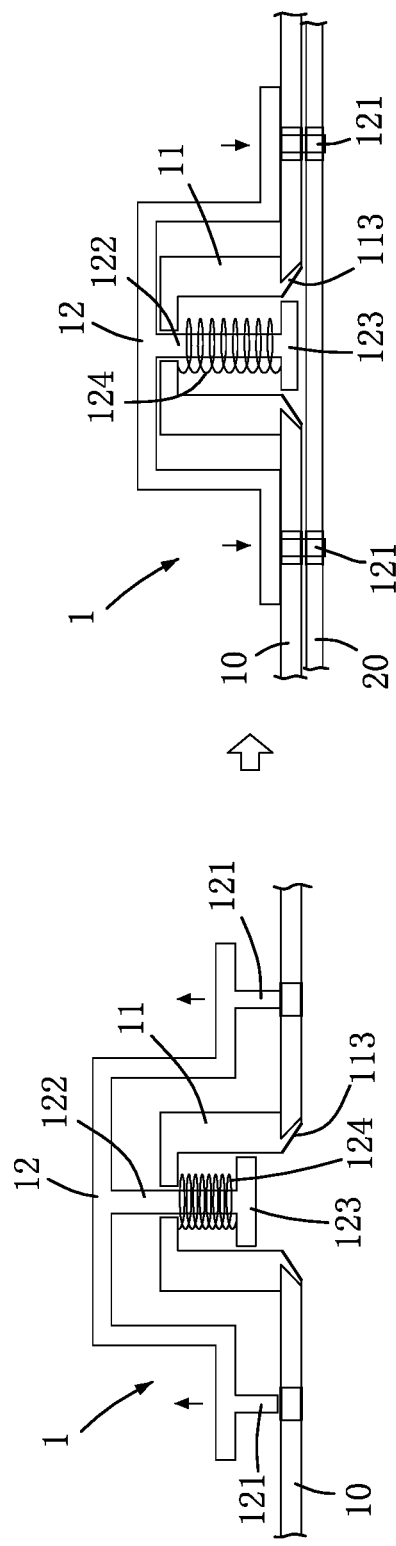
FIG. 3 is a schematic view of state of use of the joint structure according to the second embodiment of the present disclosure.

Referring to FIG. 3, as shown in the drawing, the embodiment is different from the above embodiment in that the quantity of the first joint part 121 may be one, two or more, and the number of the first joint part in the embodiment is two.

In an embodiment of the disclosure, the assembling part 111 has an expansion part 113, so that the expansion part 113 is pressed by an external force to be deformed and expanded, and is assembled with the first object 10.

When the joint structure is used, the actuating piece 12 can be pulled to make the actuating piece 12 move upwards and compress the elastic element 124, after a second object 20 that is to be fastened is set, the actuating piece 12 can be released, so that the actuating piece 12 moves downwards due to the release of the elastic force of the elastic element 124, thus allowing the first joint parts 121 to pass through the fastening into part 101 of the first object 10 and vertically fastened into the second object 20. When the second object 20 is to be separated, the actuating piece 12 can be pulled to make the actuating piece 12 move upwards and compress the elastic element 124, thus allowing the first joint parts 121 to disengage from the second object 20 (or leave the fastening into part 101 at the same time) to separate the second object 20. Accordingly, the joint structure 1 may be combined with the first object 10 and the second object 20, in order to complete the purpose of combination or separation of at least two objects.

Figure 4:
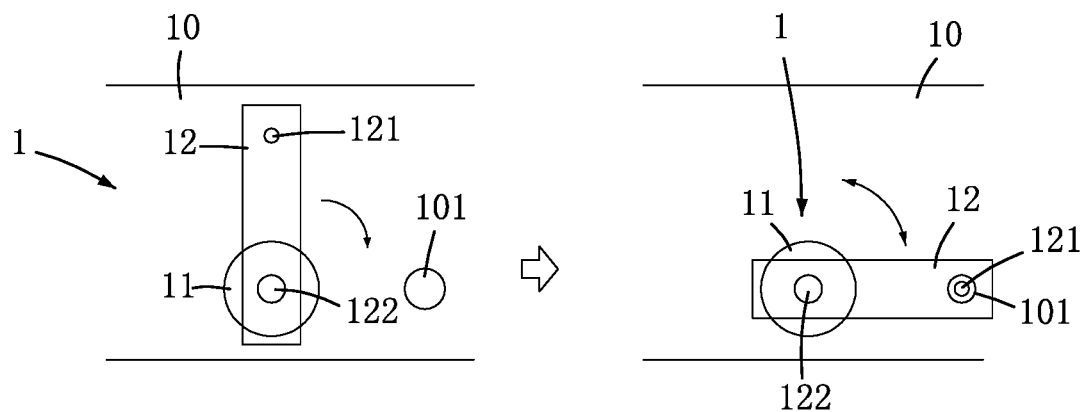
FIG. 4 is a schematic view of state of use of the joint structure according to the third embodiment of the present disclosure.
Figure 5:
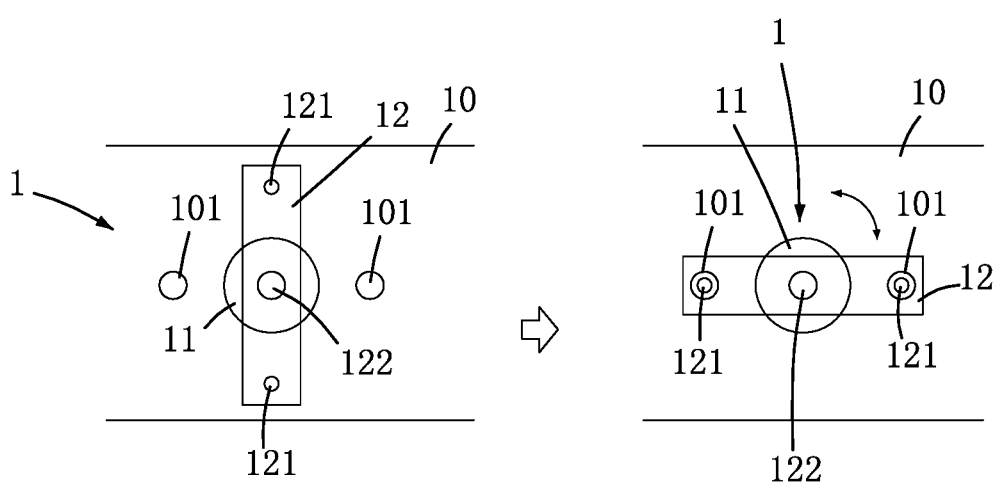
FIG. 5 is a schematic view of state of use of the joint structure according to the fourth embodiment of the present disclosure.

Referring to FIG. 4 and FIG. 5, as shown in the drawings, the embodiment is different from the above embodiment in that when the joint structure is used, the actuating piece 12 can be pulled and then turned to make the actuating piece 12 move upwards and compress the elastic element 124, after a second object 20 that is to be fastened is set, the actuating piece 12 can be released, so that the actuating piece 12 moves downwards due to the release of the elastic force of the elastic element 124, thus allowing the first joint part 121 (or the first joint parts 121) to pass through the fastening into part 101 of the first object 10 and vertically fastened into the second object 20 to make the first joint part 121 (or the first joint parts 121) carry out lateral fastening or rotational fastening. When the second object 20 is to be separated, the actuating piece 12 can be pulled and then turned to make the actuating piece 12 move upwards and compress the elastic element 124, thus allowing the first joint part 121 (or the first joint parts 121) to disengage from the second object 20 (or leave the fastening into part 101 at the same time) to separate the second object 20. Accordingly, the joint structure 1 may be combined with the first object 10 and the second object 20, in order to complete the purpose of combination or separation of at least two objects.

Figure 6:
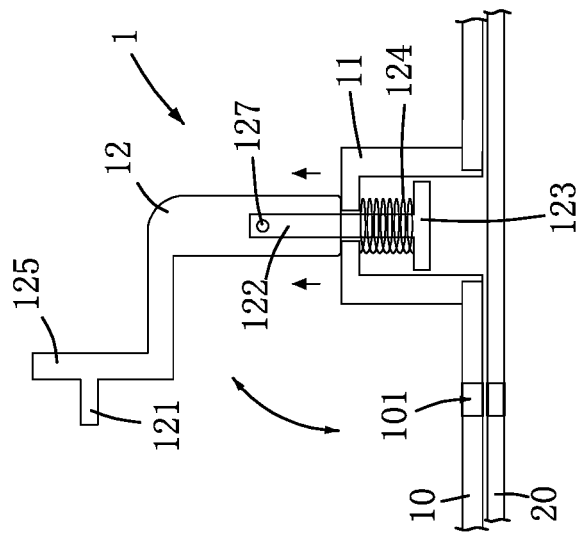
FIG. 6 is a schematic view of state of use of the joint structure according to the fifth embodiment of the present disclosure.
Figure 6:
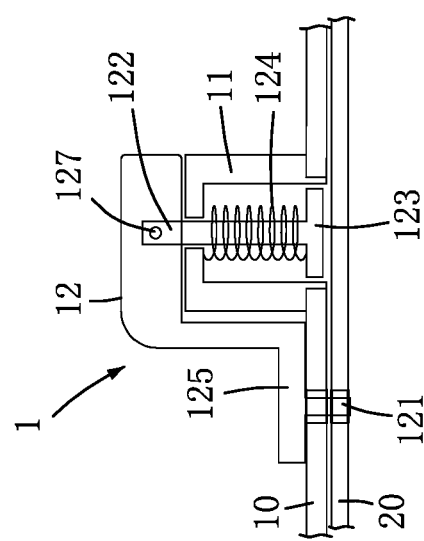

Referring to FIG. 6, as shown in the drawing, the embodiment is different from the above embodiment in that the first joint part 121 has a turning part 125, the turning part 125 combines with the rod part 122 by a bolt connection, the turning part 125 is turned to drive the first joint part 121 turning, and make the rod part 122 move up and down, wherein the lateral width and vertical width of the turning part 125 is different or the same, when it is turning, the rod part 122 moves with a different or the same distance; the actuating piece 12 carries out a bolt connection with the rod part 122 by a bolting part 127.

When the joint structure is used, the turning part 125 of the actuating piece 12 can be turned, the turning part 125 is turned to drive the first joint part 121 turning to make the rod part 122 move upwards and compress the elastic element 124, after a second object 20 that is to be fastened is set, the turning part 125 may be turned again, so that the actuating piece 12 moves downwards due to the release of the elastic force of the elastic element 124, thus allowing the first joint part 121 to pass through the fastening into part 101 of the first object 10 and vertically fastened into the second object 20. When the second object 20 is to be separated, the turning part 125 may be turned to make the actuating piece 12 move upwards and compress the elastic element 124, thus allowing the first joint part 121 to disengage from the second object 20 (or leave the fastening into part 101 at the same time) to separate the second object 20. Accordingly, the joint structure 1 may be combined with the first object 10 and the second object 20, in order to complete the purpose of combination or separation of at least two objects.

Figure 7:
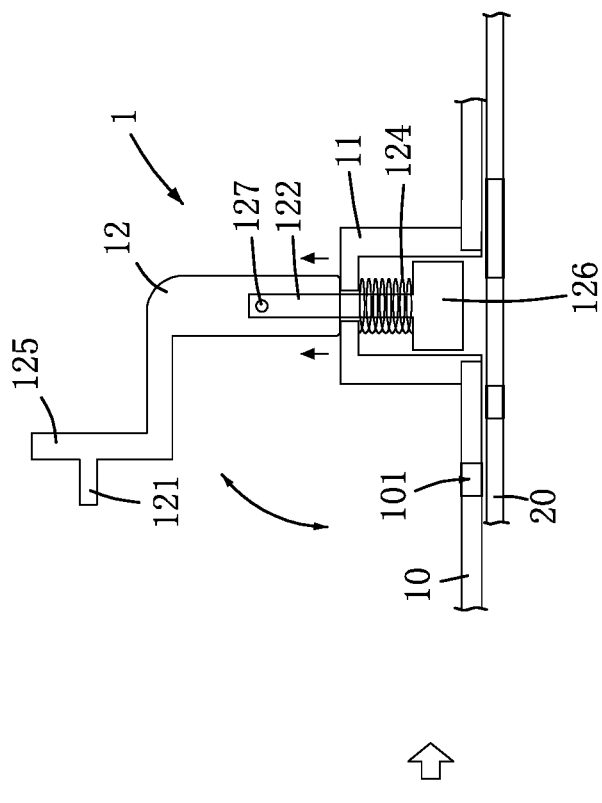
FIG. 7 is a schematic view of state of use of the joint structure according to the sixth embodiment of the present disclosure.
Figure 7:
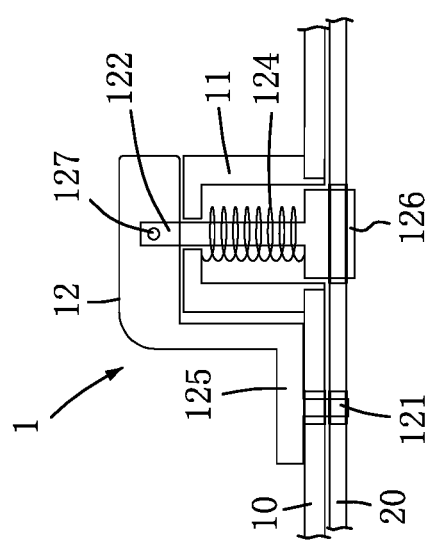
Figure 8:
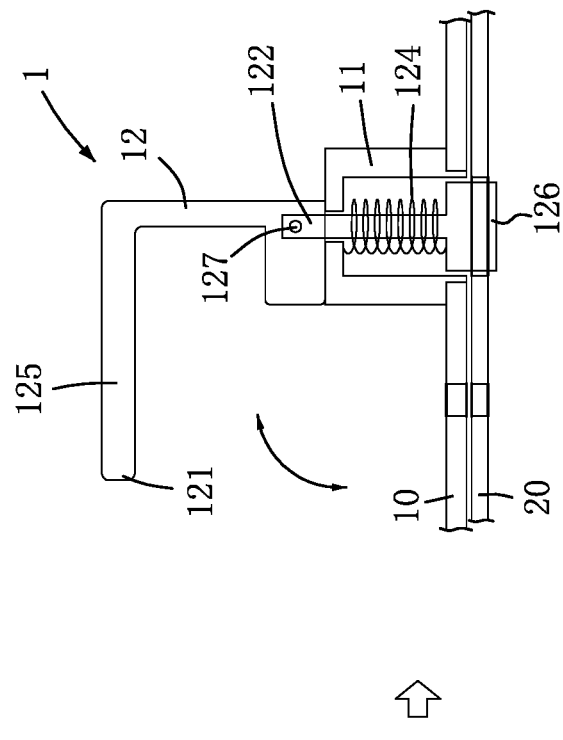
FIG. 8 is a schematic view of state of use of the joint structure according to the seventh embodiment of the present disclosure.
Figure 8:
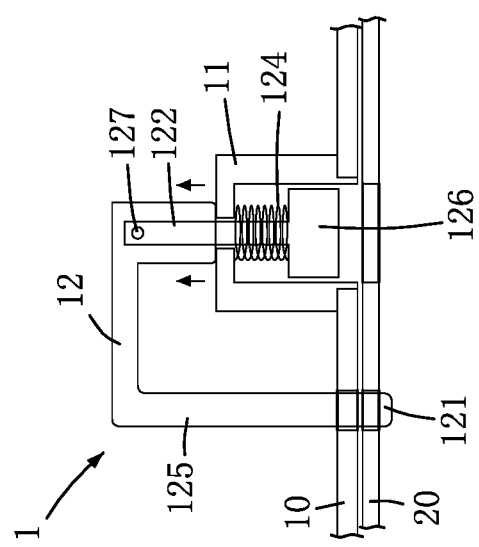

Referring to FIG. 7 and FIG. 8, as shown in the drawings, the embodiment is different from the above embodiment in that the actuating piece 12 has a first joint part 121, a rod part 122 and a second joint part 126, the first joint part 121 has a turning part 125, the rod part 122 combines movably inside the body part 11, so that the actuating piece 12 combines movably with the body part 11, the first joint part 121 is located outside of the body part 11, when the turning part 125 is turned, the second joint part 126 is driven to move, and thus the second joint part 126 can carry out a vertical movement, lateral movement or rotational movement.

In addition, the joint structure 1 of the disclosure may also set the first joint part 121 and the second joint part 126 simultaneously according to the requirement of the practical application, or only set the second joint part 126 (not shown in the drawings), so that the present disclosure can further meet the requirement of practical application.

In an embodiment of the joint structure 1 of the present disclosure, one end of the elastic element 124 abuts against the body part 11, and the other end of the elastic element 124 abuts against the second joint part 126 located in the body part 11; and the elastic element 124 normally abuts against the body part 11 and the second joint part 126 of the actuating piece 12, so that the first joint part 121 of the actuating piece 12 and the second joint part 126 are normally pushed by the elastic force, and applies a reciprocating elastic force downwards.

When the joint structure is used, the turning part 125 of the actuating piece 12 can be turned, the turning part 125 is turned to drive the first joint part 121 turning to make the rod part 122 and the second joint part 126 move upwards and compress the elastic element 124, after a second object 20 that is to be fastened is set, the turning part 125 may be turned again, so that the actuating piece 12 moves downwards due to the release of the elastic force of the elastic element 124, thus allowing the second joint part 126 to pass through the fastening into part 101 of the first object 10 and vertically fastened into the second object 20. When the second object 20 is to be separated, the turning part 125 may be turned to make the actuating piece 12 move upwards and compress the elastic element 124, thus allowing the second joint part 126 to disengage from the second object 20 (or leave the fastening into part 101 at the same time) to separate the second object 20. Accordingly, the joint structure 1 may be combined with the first object 10 and the second object 20, in order to complete the purpose of combination or separation of at least two objects.

Figure 9:
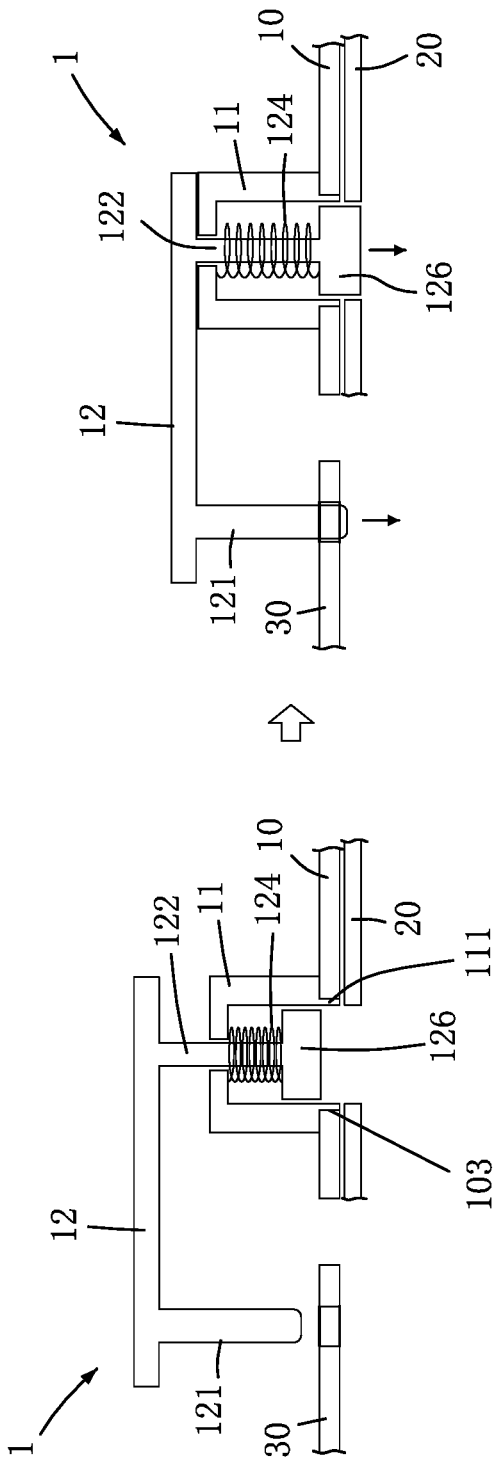
FIG. 9 is a schematic view of state of use of the joint structure according to the eighth embodiment of the present disclosure.
Figure 10:
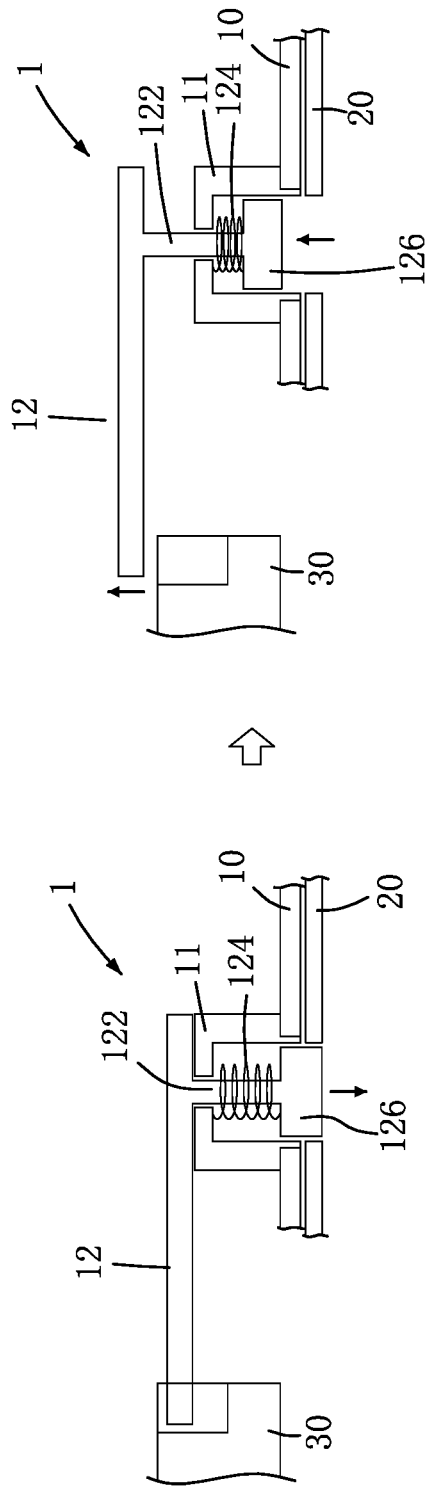
FIG. 10 is a schematic outside view of state of use of the joint structure according to the ninth embodiment of the present disclosure.

Referring to FIG. 9 and FIG. 10, as shown in the drawings, the embodiment is different from the above embodiment in that the first joint part 121 of the joint structure 1 and the second joint part 126 may simultaneously carry out fastening and simultaneously carry out unfastening, so that the first joint part 121 is fastened in and unfastened from the third object 30, and the second joint part 126 is fastened in and unfastened from the second object 20. In addition, the first joint part 121 and the second joint part 126 may carry out fastening respectively and carry out unfastening respectively (not shown in the drawings). Accordingly, the joint structure 1 may be combined with the first object 10, the second object 20 and the third object 30 to carry out fastening or unfastening, in order to complete the purpose of combination or separation of at least two objects.

Figure 11:
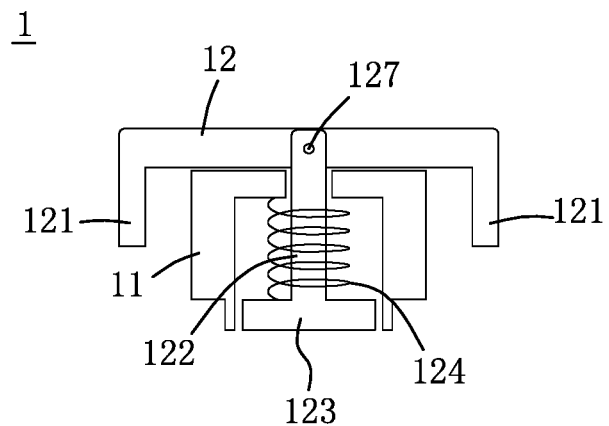
FIG. 11 is a schematic view of the joint structure according to the tenth embodiment of the present disclosure.

Referring to FIG. 11, as shown in the drawing, the embodiment is different from the above embodiment in that the actuating piece 12 carries out a bolt connection with the rod part 122 by a bolting part 127, and one end of the elastic element 124 abuts against the body part 11, and the other end of the elastic element 124 abuts against the stop part 123, so that the first joint part 121 of the joint structure 1 and the second joint part 126 may simultaneously carry out fastening and simultaneously carry out unfastening. Accordingly, the purpose of combination or separation of at least two objects can be completed.

Figure 12:
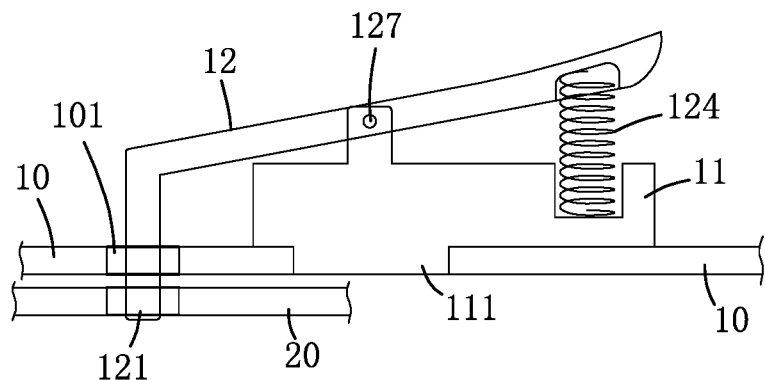
FIG. 12 is schematic view 1 of state of use of the joint structure according to the eleventh embodiment of the present disclosure.
Figure 13:
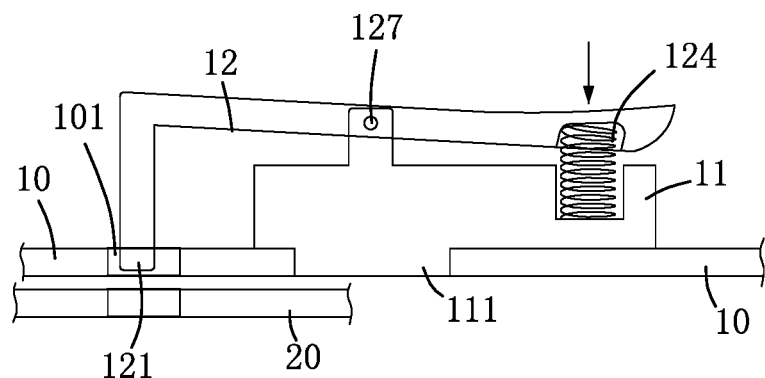
FIG. 13 is a schematic view 2 of state of use of the joint structure according to the eleventh embodiment of the present disclosure.

Referring to FIG. 12 and FIG. 13, as shown in the drawings, the embodiment is different from the above embodiment in that the actuating piece 12 carries out a bolt connection with the rod part 122 by a bolting part 127, and one end of the elastic element 124 abuts against the body part 11, and the other end of the elastic element 124 abuts against the actuating piece 12.

When the joint structure is used, the actuating piece 12 can be pressed downwards to make the actuating piece 12 move upwards and compress the elastic element 124, after a second object 20 that is to be fastened is set, the actuating piece 12 can be released, so that the actuating piece 12 moves downwards due to the release of the elastic force of the elastic element 124, thus allowing the second joint part 126 to pass through the fastening into part 101 of the first object 10 and vertically fastened into the second object 20. When the second object 20 is to be separated, the actuating piece 12 can be pressed downwards to make the actuating piece 12 move upwards and compress the elastic element 124, thus allowing the second joint part 126 to disengage from the second object 20 (or leave the fastening into part 101 at the same time) to separate the second object 20. Accordingly, the joint structure 1 may be combined with the first object 10 and the second object 20, in order to complete the purpose of combination or separation of at least two objects.

Figure 14:
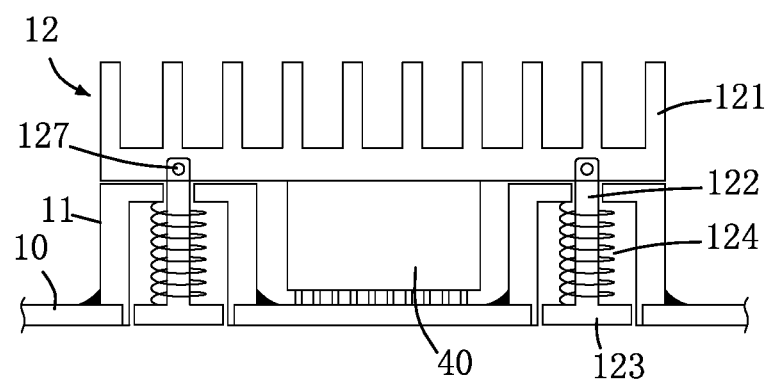
FIG. 14 is a schematic view of state of use of the joint structure according to the twelfth embodiment of the present disclosure.

Referring to FIG. 14, as shown in the drawing, the embodiment is different from the above embodiment in that the first joint part 121 is a heat dissipating element or a cooling device, the heat dissipating element is a heat dissipating sheet, radiator, heat dissipating paste or heat dissipating solution, it can be moved upwards and then pressed downwards to a hot electronic element 40, to assist in heat dissipation or to assist a stable signal transmission of the hot electronic element 40.

Figure 15:
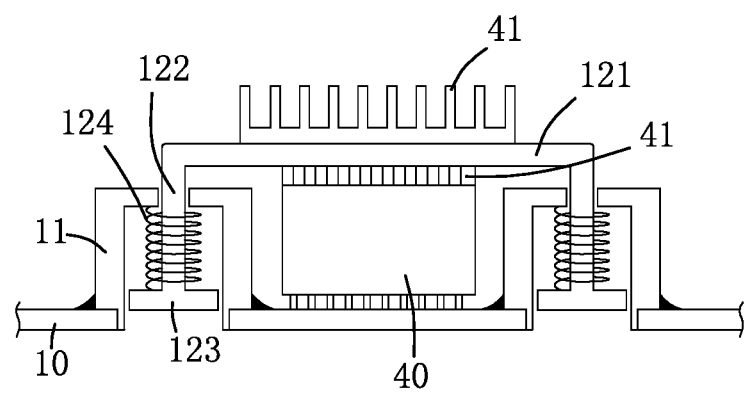
FIG. 15 is a schematic view of state of use of the joint structure according to the thirteenth embodiment of the present disclosure.

Referring to FIG. 15, as shown in the drawing, the embodiment is different from the above embodiment in that the first joint part 121 may be stacked with a heat dissipating element 41 or a heat dissipating substance thereon to assist in heat dissipation or to assist a stable signal transmission of the hot electronic element 40.

Figure 16:
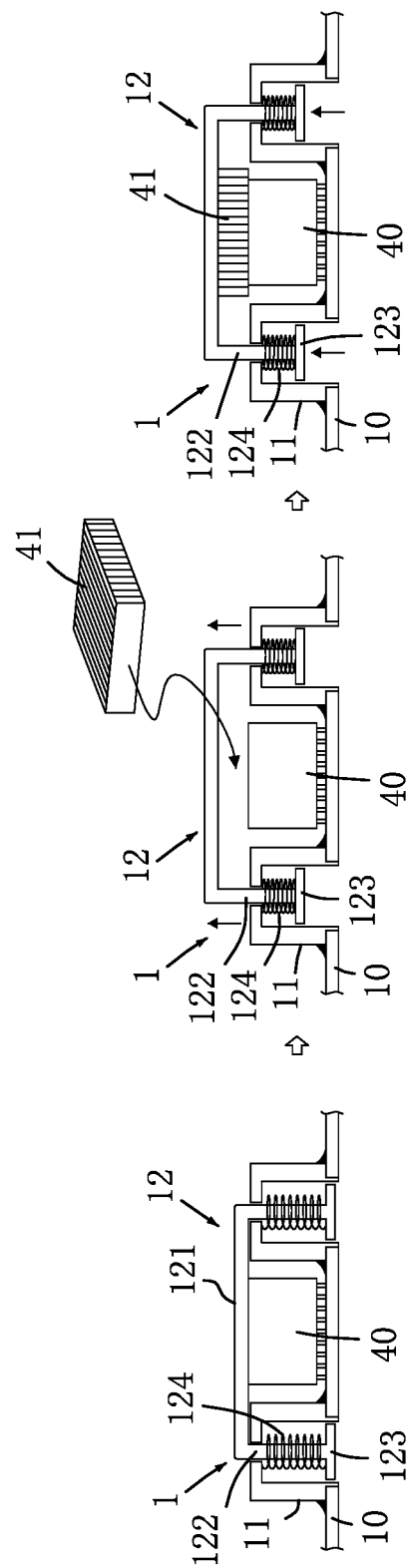
FIG. 16 is a schematic view of state of use of the joint structure according to the fourteenth embodiment of the present disclosure.

Referring to FIG. 16, as shown in the drawing, the embodiment is different from the above embodiment in that a heat dissipating element 41 is placed between the actuating piece 12 and the hot electronic element 40 after the first joint part 121 is moved upwards to assist in heat dissipation or to assist a stable signal transmission of the hot electronic element 40.

Figure 17:
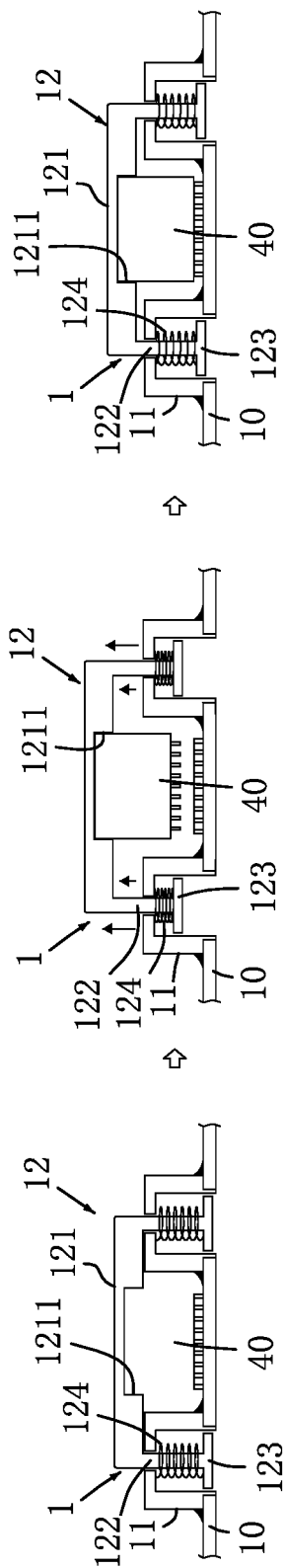
FIG. 17 is a schematic view of state of use of the joint structure according to the fifteenth embodiment of the present disclosure.
Figure 18:
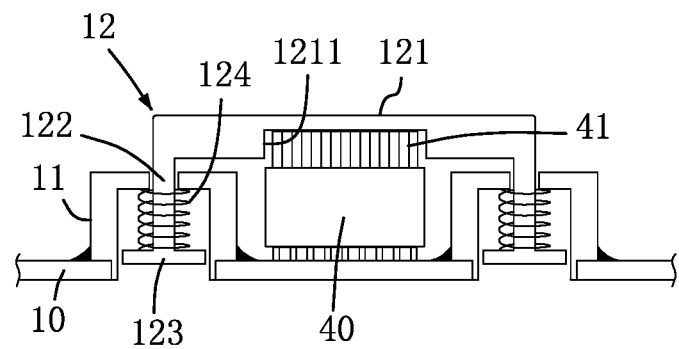
FIG. 18 is a schematic view of state of use of the joint structure according to the sixteenth embodiment of the present disclosure.

Referring to FIG. 17 and FIG. 18, as shown in the drawings, the embodiment is different from the above embodiment in that the first joint part 121 has a position limiting structure 1211 (as shown in FIG. 17), which is used to limit the position of a heat dissipating element 41, a heat dissipating substance or a hot electronic element 40. As shown in FIG. 17, the position limiting structure 1211 is used to limit the hot electronic element 40; as shown in FIG. 18, the position limiting structure 1211 is used to limit the heat dissipating element 41, so that the present disclosure can further meet the requirement of practical application of heat dissipation.

Figure 19:
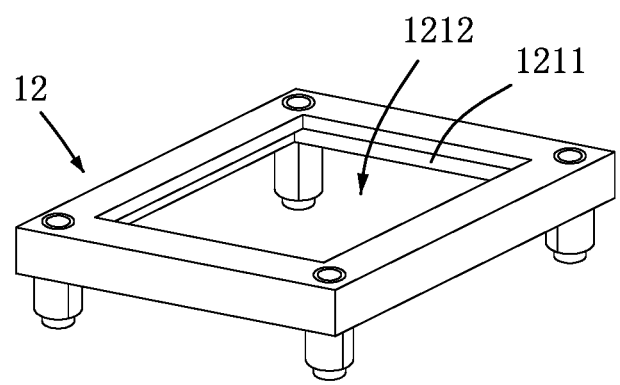
FIG. 19 is a schematic outside view of the joint structure according to the seventeenth embodiment of the present disclosure.
Figure 20:
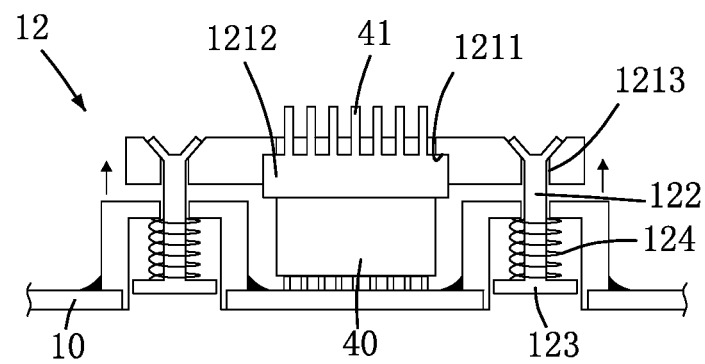
FIG. 20 is a schematic view of state of use of the joint structure according to the seventeenth embodiment of the present disclosure.

Referring to FIG. 19 and FIG. 20, as shown in the drawings, the embodiment is different from the above embodiment in that the actuating piece 12 has a passing part 1212, the first joint part 121 may be pressed downwards to make the heat dissipating element 41 set in the passing part 1212, so that the present disclosure can further meet the requirement of practical application of heat dissipation.

In an embodiment of the disclosure, the rod part 122 of the actuating piece 12 is an expansion structure, riveting structure or locking structure, and now take the expansion structure as an embodiment, the rod part 122 can be combined to an setting part 1213 of the actuating piece, in addition, the actuating piece 12 can also be integrally formed with the rod part 122 (not shown in the drawings), so that the present disclosure can further meet the requirement of practical application.

Figure 21:
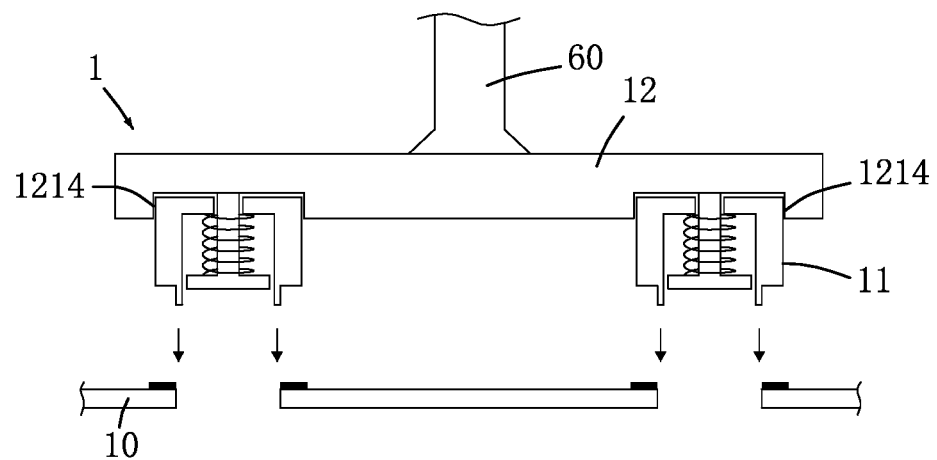
FIG. 21 is a schematic view of state of use of the joint structure according to the eighteenth embodiment of the present disclosure.

Referring to FIG. 21, as shown in the drawing, the embodiment is different from the above embodiment in that there is a floating limit part 1214 between the actuating piece 12 and the body part 11, the floating limit part 1214 limits a floating amount of the body part 11, and then the joint structure 1 is picked up by a pick-up tool 60 to make the body part 11 firmly placed in an assembly position of the first object 10, so that the present disclosure can further meet the requirement of practical application.

Figure 22:
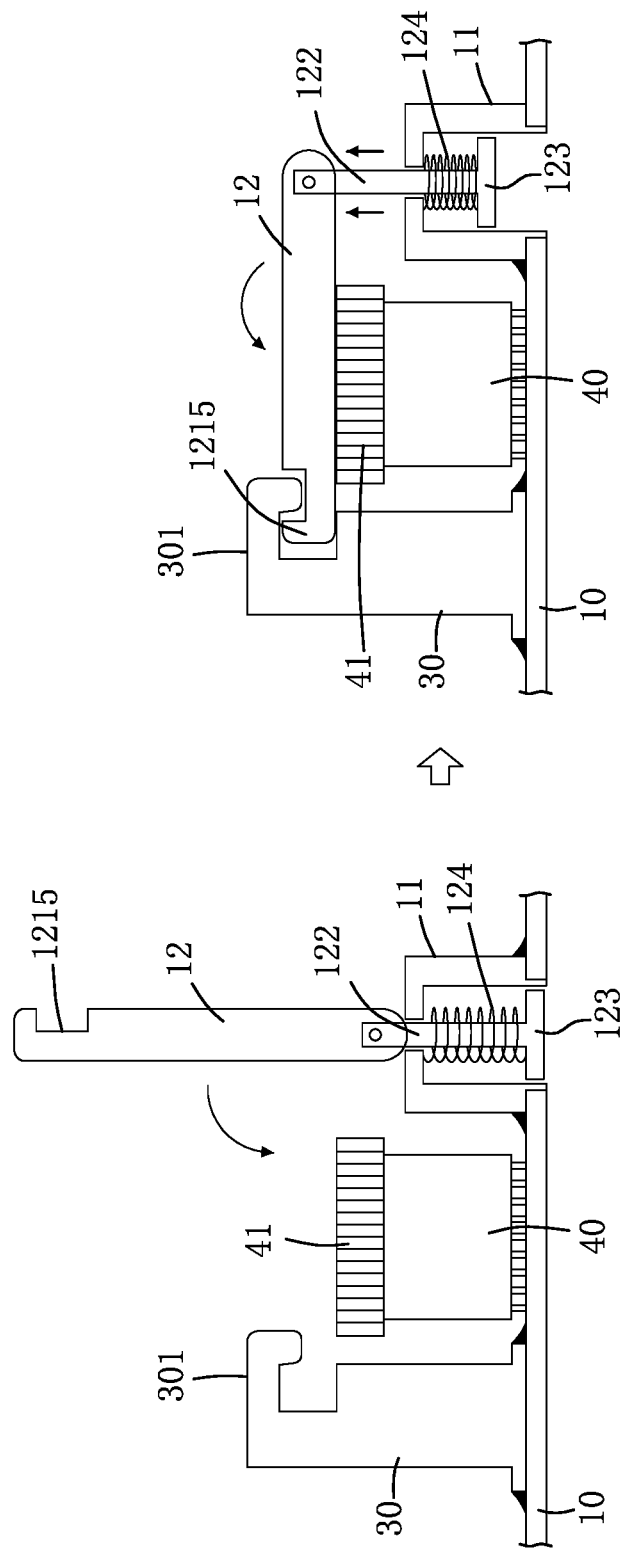
FIG. 22 is a schematic view 1 of state of use of the joint structure according to the nineteenth embodiment of the present disclosure.
Figure 23:
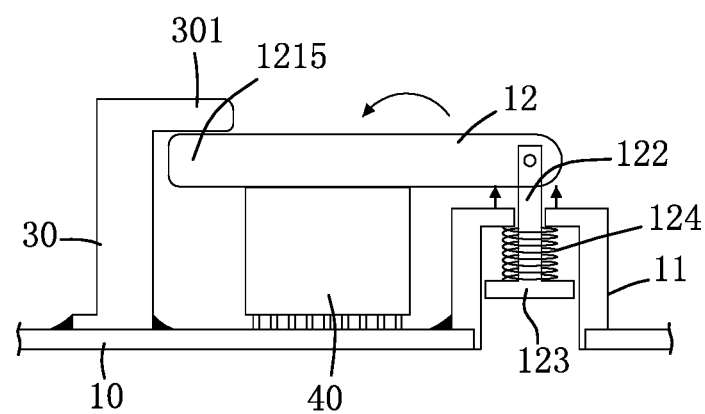
FIG. 23 is a schematic view 2 of state of use of the joint structure according to the nineteenth embodiment of the present disclosure.

Referring to FIG. 22 and FIG. 23, as shown in the drawings, the embodiment is different from the above embodiment in that the actuating piece 12 is a turning body, so that the actuating piece 12 is turned to lift the bolted rod part 122, and then connected to a third object 30, and the actuating piece is pressed downwards to join to the heat dissipating element 41 or the hot electronic element 40. As shown in FIG. 22, the actuating piece 12 is pressed downwards to join to the heat dissipating element 41 and the hot electronic element 40; as shown in FIG. 23, the actuating piece 12 is pressed downwards to join to the hot electronic element 40, so that the present disclosure can further meet the requirement of practical application of heat dissipation.

In an embodiment of the present disclosure, the actuating piece 12 has an assembling part 1215, the assembling part 1215 is assembled to an assembling part 301 of the third object 30 to make the actuating piece 12 pressed downwards and firmly joined to the heat dissipating element 41 or the hot electronic element 40, so that the present disclosure can further meet the requirement of practical application of heat dissipation.

Figure 24:
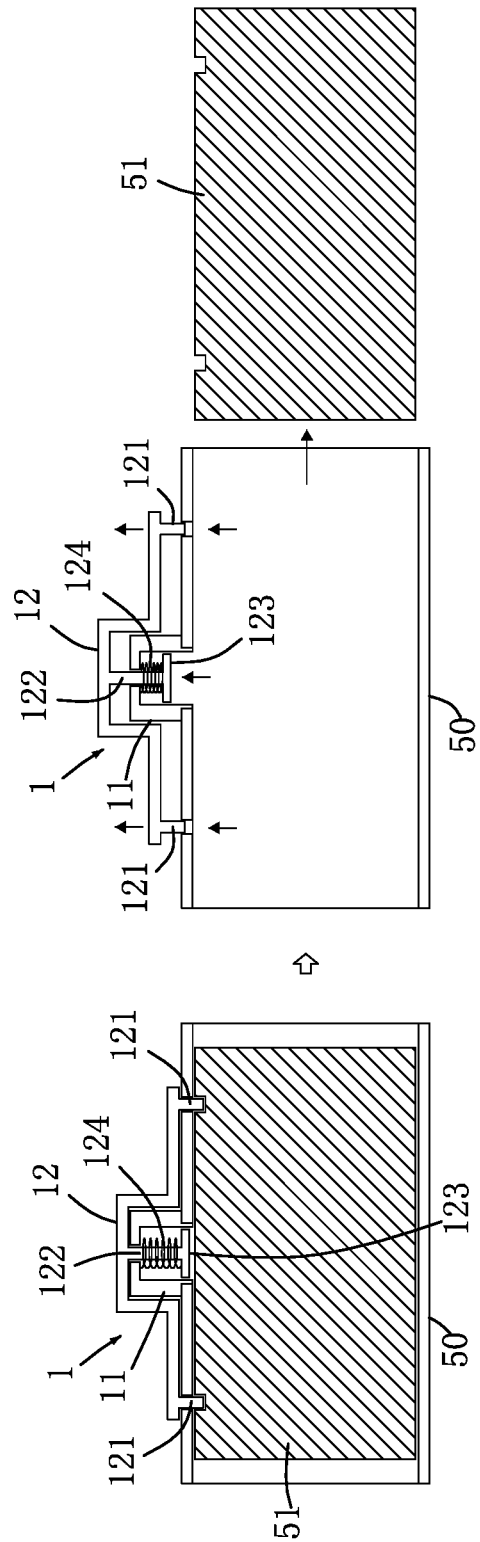
FIG. 24 is a schematic view of state of use of the joint structure according to the twentieth embodiment of the present disclosure.

Referring to FIG. 24, as shown in the drawing, the embodiment is different from the above embodiment in that the joint structure 1 is assembled to a retaining body 50 to make the first joint part 121 fastened into an object 51, so that a position of the object 51 is limited to the retaining body 50, and the first joint part 121 can be moved upwards to disengage from the object 51, and thus the object 51 can be disengaged from the retaining body 50, so that the present disclosure can further meet the requirement of practical application of heat dissipation.

In an embodiment of the disclosure, the joint structure 1 is assembled to the object 51 or a first object, or the body part 11 is integrally formed with the object 51 or the first object, the first object is a chassis, computer case, case body, motherboard, track, PCB, computer, memory, metallic piece or plastic piece, or the joint structure 1 is assembled to a retaining body 50 to make the first joint part 121 (or the second joint part 126) fastened into an object, so that the position of the object 51 is limited to the retaining body 50, or the first joint part 121 (or the second joint part 126) can be moved upwards to disengage from the object, and thus the object can be disengaged from the retaining body 50, wherein the retaining body 50 is a chassis, computer case, case body, motherboard, track, PCB, computer, memory, metallic piece or plastic piece, or the object 51 is a chassis, computer case, case body, motherboard, track, PCB, computer, memory, metallic piece or plastic piece.

Figure 25:
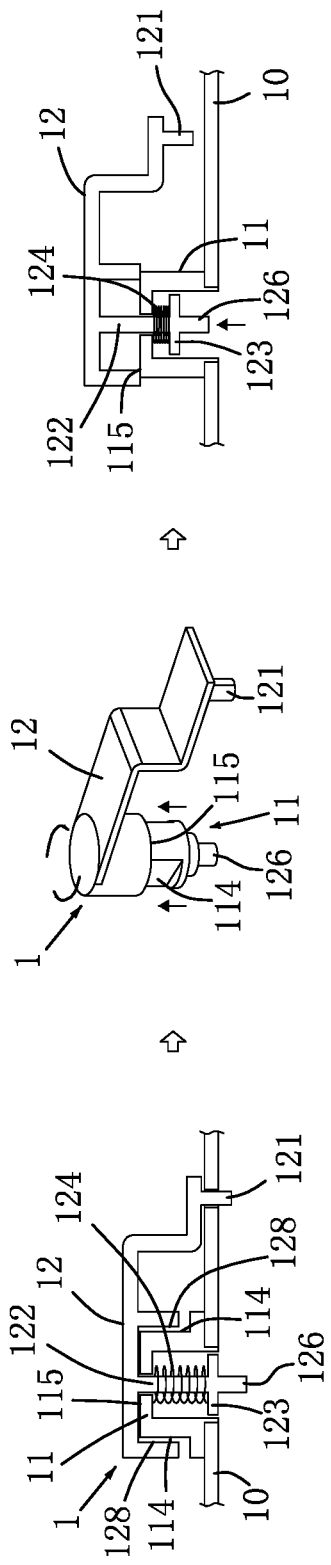
FIG. 25 is a schematic view of state of use of the joint structure according to the twenty-first embodiment of the present disclosure.
Figure 26:
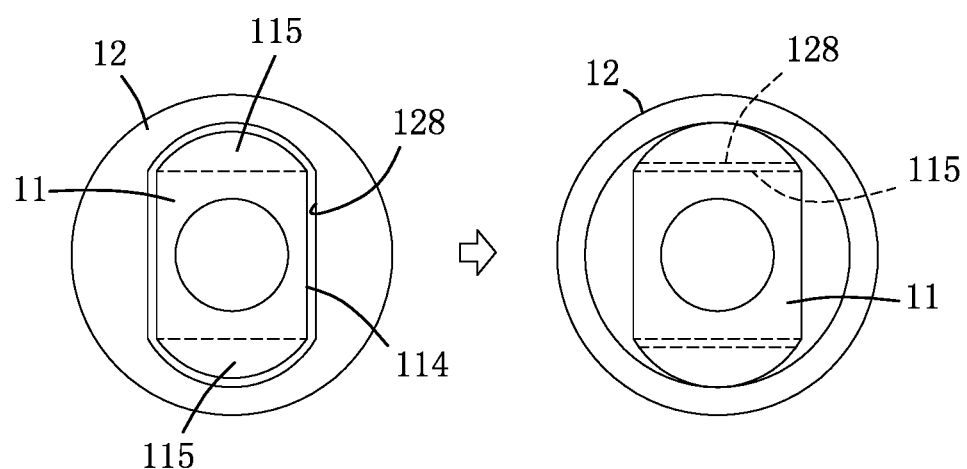
FIG. 26 is a schematic bottom view of state of use of the joint structure according to the twenty-first embodiment of the present disclosure.

Referring to FIG. 25 and FIG. 26, as shown in the drawings, the embodiment is different from the above embodiment in that the body part 11 has an anti-rotation part 114, the actuating piece 12 has a corresponding anti-rotation part 128, the anti-rotation part 114 and the corresponding anti-rotation part 128 are anti-rotational mutually, and the corresponding anti-rotation part 128 can be lifted upwards to disengage from the anti-rotation part 114, the actuating piece 12 is turned to a bearing part 115 of the body part 11 to make the actuating piece 12 stay or temporarily stay at the bearing part 115, so that the present disclosure can further meet the requirement of practical application of heat dissipation.

In an embodiment of the disclosure, the anti-rotation part 114 is a cut side, split side, split groove, cut groove, concave part, convex part or step part that corresponds to the corresponding anti-rotation part 128, so that the present disclosure can further meet the requirement of practical application.

Figure 27:
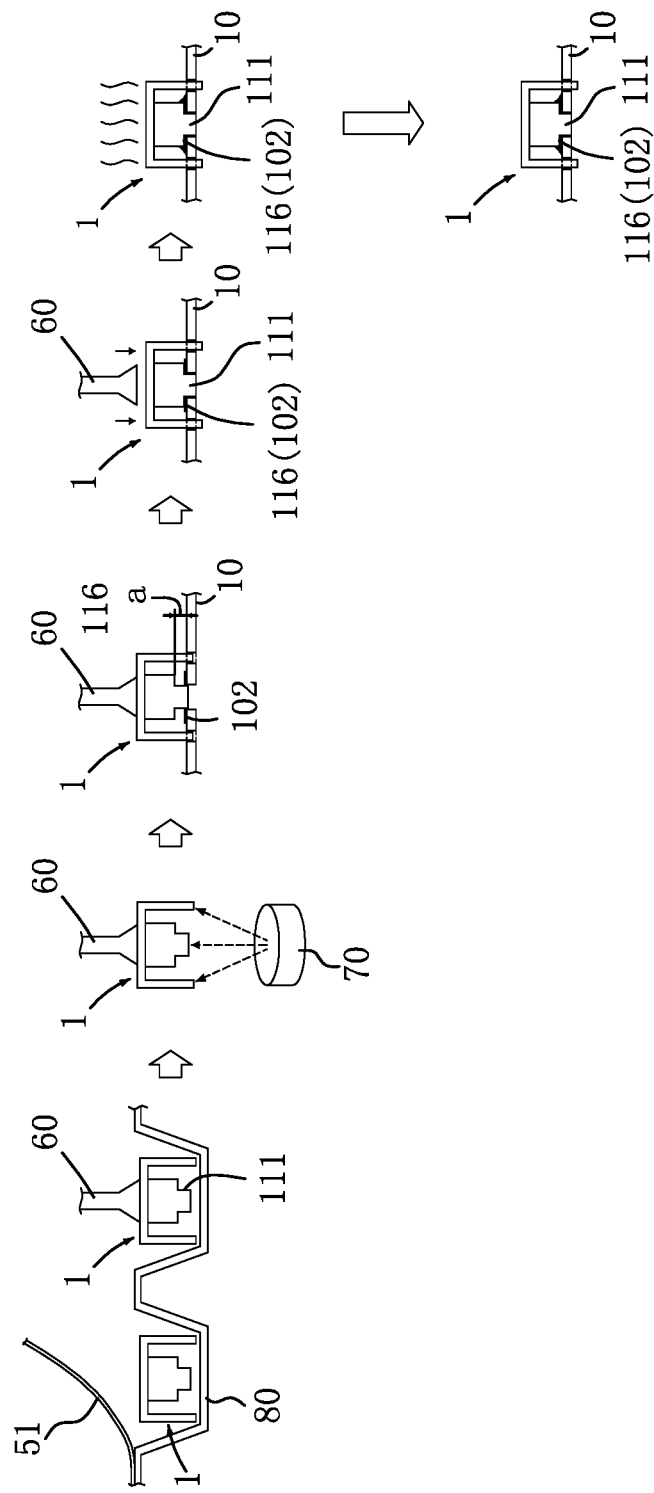
FIG. 27 is a schematic view of state of assembly of the joint structure of the present disclosure.

Referring to FIG. 27, as shown in the drawing, the disclosure provides a method of assembling a joint structure on an object, and when assembled, the joint structure 1 is picked up from a carrier 80 by a pick-up tool 60, and placed at an assembly position of the first object 10 after a distance or position is matched by a matching device 70; after the joint structure 1 is picked up by the pick-up tool 60, the joint structure 1 may be loosened or released at a preset height a to make the joint structure 1 fall to the assembly position of the first object 10, in order to carry out the assembly of the joint structure 1 and the first object 10.

In an embodiment of the disclosure, a surface of the body part 11 has a solderable layer 116, the solderable layer 116 of the body part 11 is heated to be soldered to a solderable layer 102 of the first object 10, in order to carry out the assembly of the joint structure 1 and the first object 10, wherein the first object 10 is a PCB, so that the present disclosure can further meet the requirement of practical application.

In an embodiment of the disclosure, the solderable layer 116 of the body part 11 may be a tin or nickel layer, and has a copper layer in the tin or nickel layer. In addition, the solderable layer 102 of the first object 10 is a preset tin layer on the copper layer that is heated to be soldered to carry out the assembly of the joint structure 1 and the first object 10, so that the present disclosure can further meet the requirement of practical application.

Figure 28:
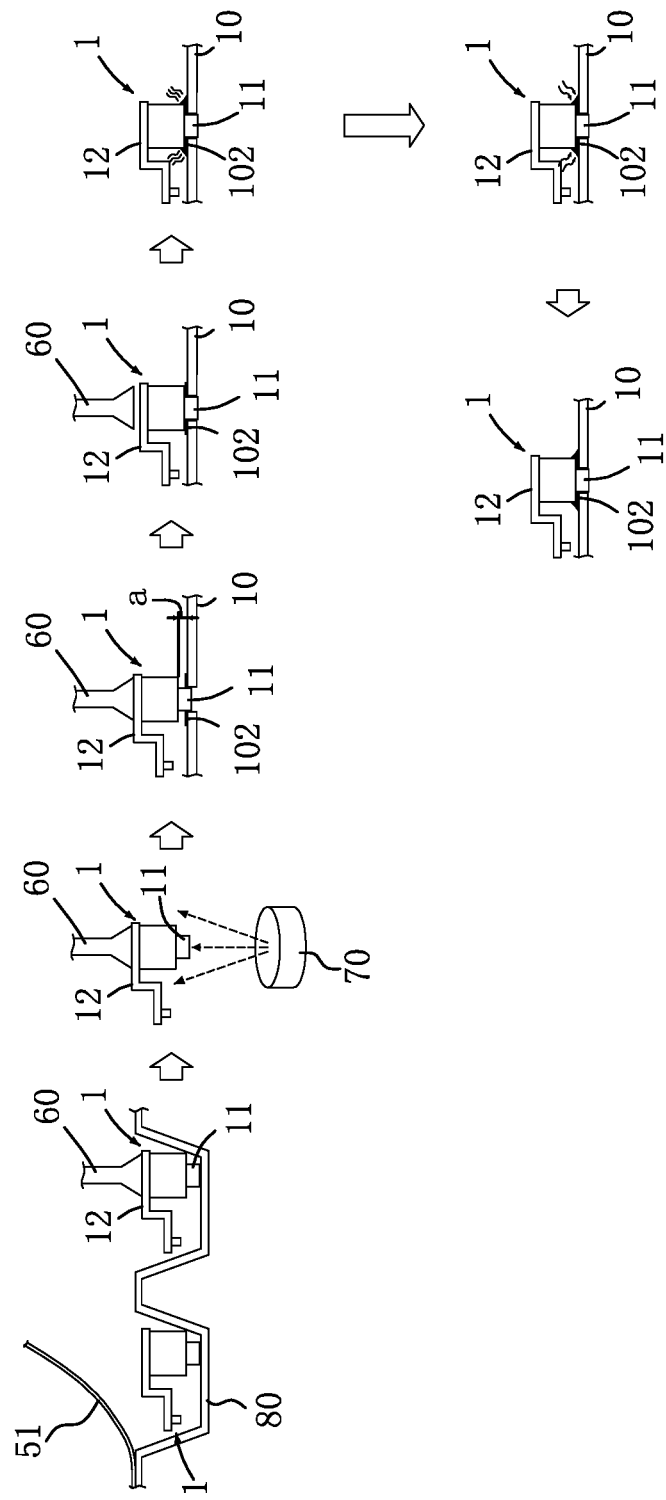
FIG. 28 is a schematic view 1 of the joint structure assembling to an object of the present disclosure.

Referring to FIG. 28, as shown in the drawing, the disclosure further provides a method of assembling a joint structure on an object, comprising the following steps:

providing a pick-up tool 60 to pick up the joint structure 1 (may pick up from the position of the actuating piece 12);

using the pick-up tool 60 to move the joint structure 1 to a preset height a over an assembly position of the first object 10, and locating a part of an assembling part 111 of the joint structure 1 in an assembly hole of the first object 10;

loosening or releasing the joint structure 1 from the pick-up tool 60 to make the joint structure 1 fall to the assembly position of the first object 10. Accordingly, the disclosure can combine the joint structure 1 to the first object 10.

In an embodiment of the disclosure, after the joint structure 1 is picked up by the pick-up tool 60, a matching device 70 is provided to match an assembly position or an assembly distance of the joint structure 1 to the first object 10; the pick-up tool 60 is used to move the joint structure 1 to a preset height a over the assembly position of the first object 10 according to matching information of the matching device 70; the joint structure 1 is loosened or released from the pick-up tool 60 to make the joint structure 1 fall to the assembly position of the first object 10. Accordingly, the disclosure can combine the joint structure 1 to the first object 10.

In an embodiment of the disclosure, after the joint structure 1 is picked up by the pick-up tool 60, a matching device 70 is provided to match a position or distance of the joint structure 1 to a solderable layer 102 on an assembly position of the first object 10; the pick-up tool 60 is used to move the joint structure 1 to a preset height a over the solderable layer 102 of the first object 10 according to matching information of the matching device 70; the joint structure 1 is loosened or released from the pick-up tool 60 to make the joint structure 1 fall to the solderable layer 102 of the first object 10, so that the body part 11 combines with the solderable layer 102 of the first object 10 by soldering. Accordingly, the disclosure can combine the joint structure 1 to the first object 10.

In addition, after the joint structure 1 is picked up by the pick-up tool 60, a matching device 70 is provided to match an assembly position or an assembly distance of the joint structure 1 to the first object 10; the pick-up tool 60 is used to move the joint structure 1 to the assembly position of the first object 10 according to matching information of the matching device 70; the joint structure 1 is loosened or released from the pick-up tool 60 to make the joint structure 1 assemble to the assembly position of the first object 10. Alternatively, after the joint structure 1 is picked up by the pick-up tool 60, a matching device 70 is provided to match a position or distance of the joint structure to a solderable layer 102 on an assembly position of the first object 10; the pick-up tool 60 is used to move the joint structure 1 to the solderable layer 102 of the first object 10 according to matching information of the matching device 70; the joint structure 1 is loosened or released from the pick-up tool 60 to make the joint structure 1 assemble to the solderable layer 102 of the first object 10, so that the present disclosure can further meet the requirement of practical assembly.

Moreover, in an embodiment of the disclosure, the joint structure 1 may also be picked by the pick-up tool 60 to make the pick-up tool 60 move the joint structure 1 to an assembly position of the first object 10, so that the joint structure 1 assembles to the assembly position of the first object 10, or the joint structure 1 is loosened or released from the pick-up tool 60 to make the joint structure 1 assemble to the assembly position of the first object 10; also, when assembled, after the joint structure 1 is picked up by a pick-up tool 60, a matching device 70 is provided to match an assembly position or an assembly distance of the joint structure 1 to the first object 10; the pick-up tool 60 is used to assemble the joint structure 1 to the assembly position of the first object 10 according to matching information of the matching device 70, or after the joint structure is picked up by the pick-up tool 60, a matching device 70 is provided to match a position or distance of the joint structure to a solderable layer 102 on an assembly position of the first object 10; the pick-up tool 60 is used to move the joint structure 1 to the solderable layer 102 of the first object according to matching information of the matching device 70 to make the joint structure 1 assemble to the solderable layer 102 of the first object 10 (not shown in the drawings), so that the present disclosure can further meet the requirement of practical assembly.

Figure 29:
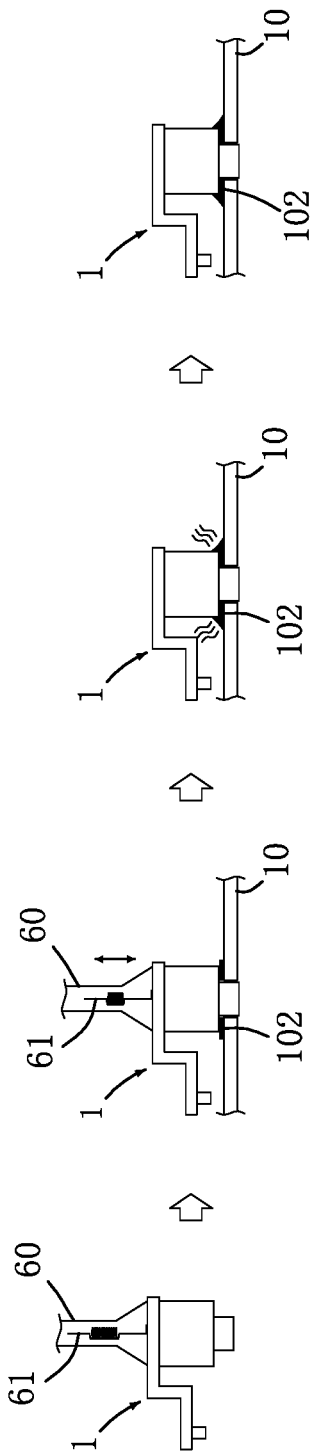
FIG. 29 is a schematic view 2 of the joint structure assembling to an object of the present disclosure.

Referring to FIG. 29, as shown in the drawing, the disclosure further provides a method of assembling a joint structure on an object, comprising the following steps: providing a pick-up tool 60 to pick up the joint structure 1; using the pick-up tool 60 to move the joint structure 1 to an assembly position of the first object 10; pressing down the joint structure 1 on the first object by the pick-up tool 60, in order to place the joint structure 1 on the assembly position of the first object 10; the way of pressing down of the aforementioned pick-up tool 60 may be elastically pressing down.

In an embodiment of the disclosure, a pick-up tool 60 can be provided to pick up the joint structure 1; the pick-up tool 60 is used to move the joint structure 1 to an assembly position of the first object 10; after the pick-up tool 60 senses a feedback message of the joint structure 1 contacting with the first object 10, the fastener structure 1 is loosened or released from the pick-up tool 60 to make the joint structure 1 placed on the assembly position of the first object 10.

The pick-up tool 60 has a sensor 61, and when the pick-up tool 60 moves the joint structure 1 to the assembly position of the first object 10, the pick-up tool 60 can loosen or release the joint structure 1 after the sensor 61 of the pick-up tool 60 senses a feedback message of the joint structure 1 contacting with the first object 10, so that the joint structure 1 is placed on the assembly position of the first object 10, and may also go with the matching device 70 or the solderable layer 102 as needed, for use in assembly with the first object 10 (not shown in the drawings), and thus the present disclosure can further meet the requirement of practical assembly.

In an embodiment of the disclosure, when the joint structure 1 contacts with the first object 10, the joint structure 1 contacts with the first object 10 to form a state of electrical continuity, so that the sensor 61 senses the electrical continuity and generates a feedback message, and the pick-up tool 60 can be driven to loosen or release the joint structure 1 by the feedback message.

Figure 30:
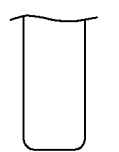
FIG. 30 is a schematic view of different type of the first joint part and the second joint part of the present disclosure.
Figure 30:
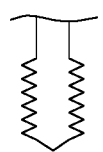
Figure 30:
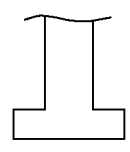
Figure 30:
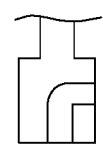
Figure 30:
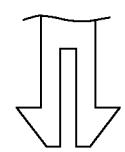

Referring to FIG. 30, as shown in the drawing, in an embodiment of the disclosure, each the first joint part 121 and the second joint part 126 is a column (shown as a portion of FIG. 30), rod body, fastening body, thread body (shown as b portion of FIG. 30), protrusion fastening body (shown as c portion of FIG. 30), inner fastening body (shown as d portion of FIG. 30) or elastically fastening body (shown as e portion of FIG. 30). Accordingly, the disclosure can further meet the requirement of practical application.

Referring to FIGS. 31-34, as shown in the drawing, an embodiment of the disclosure provides a joint module, which comprises the joint structure 1 as described in each embodiment above, wherein the actuating piece 12 has a pressed part 129, the pressed part 129 combines with the rod part 122 (the pressed part 129 combines movably the rod part 122, or the pressed part 129 is integrally formed with the rod part 122).

Figure 31:
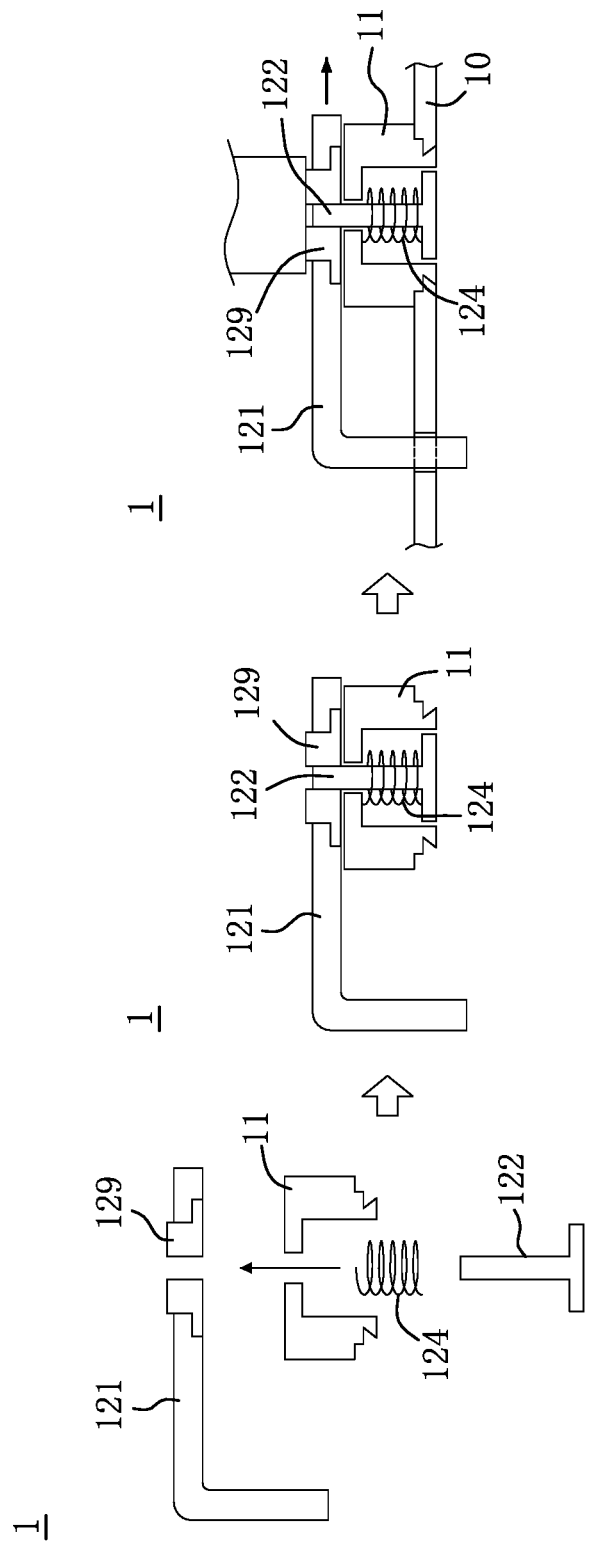
FIG. 31 is a schematic view of state of assembly of the joint structure according to the twenty-second embodiment of the present disclosure.
Figure 32:
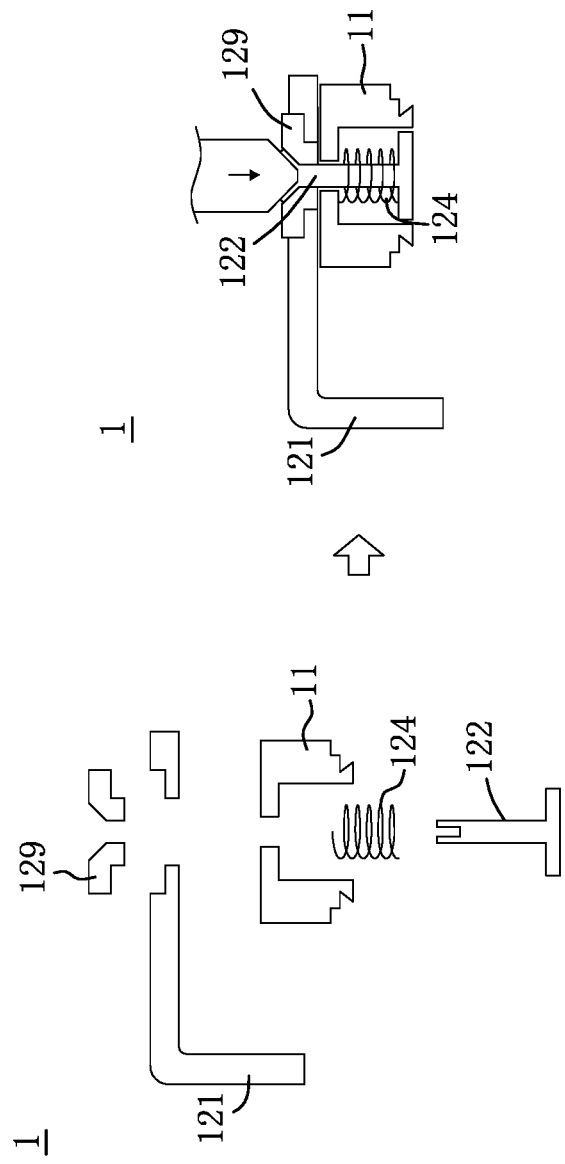
FIG. 32 is a schematic view of state of assembly of the joint structure according to the twenty-third embodiment of the present disclosure.

In an embodiment of the disclosure, the pressed part 129 may be combined with the rod part 122 by a riveted connection (as shown in FIG. 31) or an expansion connection (as shown in FIG. 32).

Figure 33:
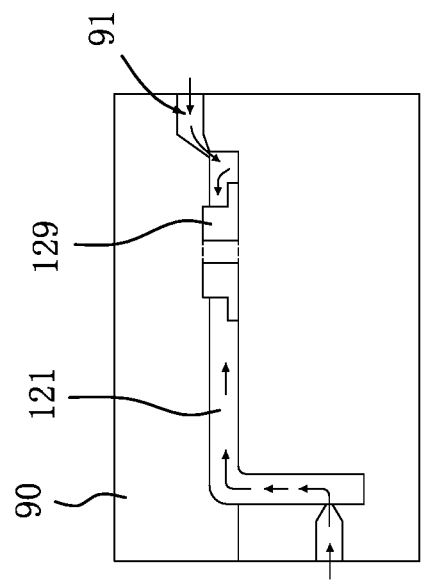
FIG. 33 is a schematic view of state of assembly of the joint structure according to the twenty-fourth embodiment of the present disclosure.

In an embodiment of the disclosure, a method of assembling the pressed part 129 is that the pressed part 129 is first combined with the first joint part 121 formed by plastic injection molding in a mold 90 (as shown in FIG. 32 and FIG. 33), and then combined with the rod part 122 by a riveted connection or an expansion connection.

Figure 34:
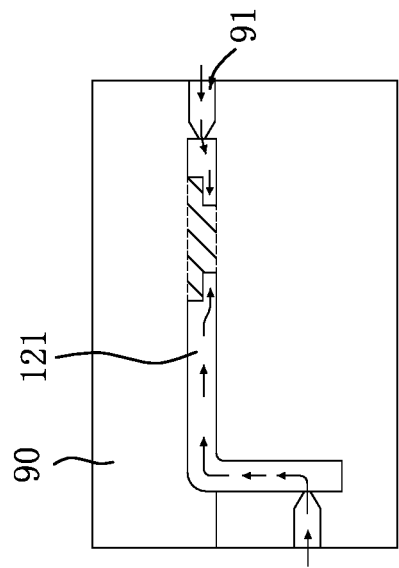
FIG. 34 is a schematic view of state of assembly of the joint structure according to the twenty-fifth embodiment of the present disclosure.

In an embodiment of the disclosure, a method of assembling the pressed part 129 is that the first joint part 121 is first formed by injection or plastic injection molding in a mold 90 (as shown in FIG. 31 and FIG. 34), and then the position of the first joint part 121 (or the second joint part 126) is limited between the pressed part 129 and the body part 11, and combined with the rod part 122 by a riveted connection or an expansion connection.

In an embodiment of the disclosure, the first joint part 121 is injected or plastic injected out of the mold 90, allowing the liquid material or liquid plastic material to enter the mold 90 from the flow channel 91, after it is cooled down, the first joint part 121 (or the second joint part 126) is formed.

In an embodiment of the disclosure, the pressed part 129 and the body part 11 are made of metallic material, used to bear an external force putting pressure on the pressed part 129 and the body part 11 for combining with a first object 10 by a riveted connection or an expansion connection, without crushing the first joint part 121 that is made of plastic, so that the disclosure can further meet the requirement of practical application.

In an embodiment of the disclosure, the position of the pressed part 129 is higher than the surface of the first joint part 121, in order to make the pressed part 129 first bear the external force putting pressure when the external force is used to put pressure, instead of the first joint part 121 made of plastic, in order to avoid crushing the first joint part 121 made of plastic, so that the disclosure can further meet the requirement of practical application.

Figure 35:
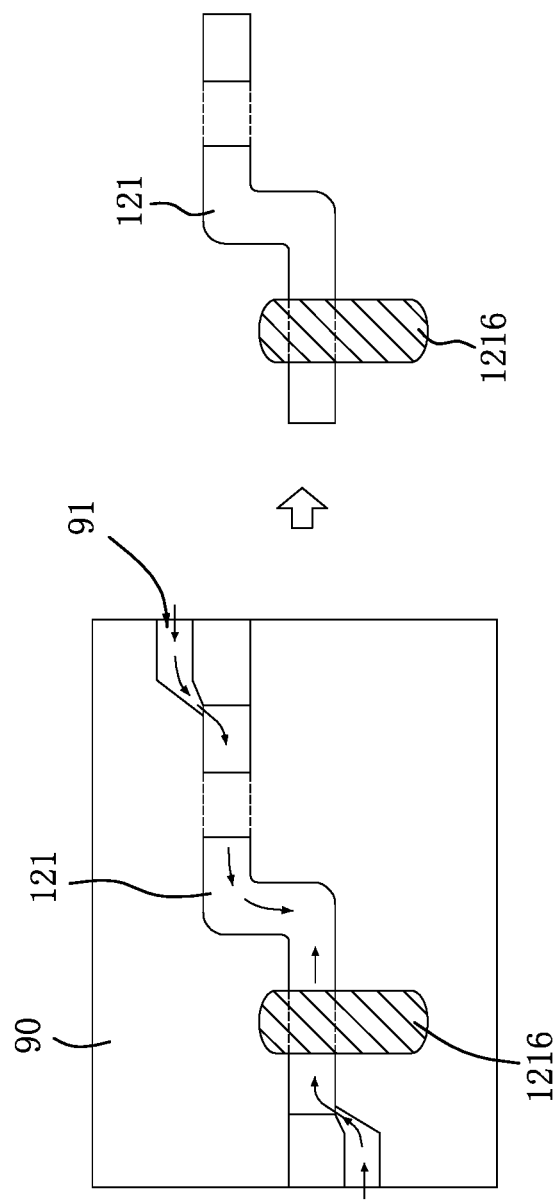
FIG. 35 is a schematic view of state of assembly of the joint structure according to the twenty-sixth embodiment of the present disclosure.

Referring to FIG. 35, as shown in the drawing, in an embodiment of the disclosure, the first joint part 121 (or the second joint part 126) has a fastening part 1216, the fastening part 1216 is made of metallic material or plastic material, the first joint part 121 is made of metallic material or plastic material, and the fastening part 1216 is combined fixedly with the first joint part 121, and the first joint part 121 is combined with the fastening part 1216 by plastic buried in the mold 90 injection, a riveting connection, expansion connection or snap connection, so that the disclosure can further meet the requirement of practical application.

Figure 36:
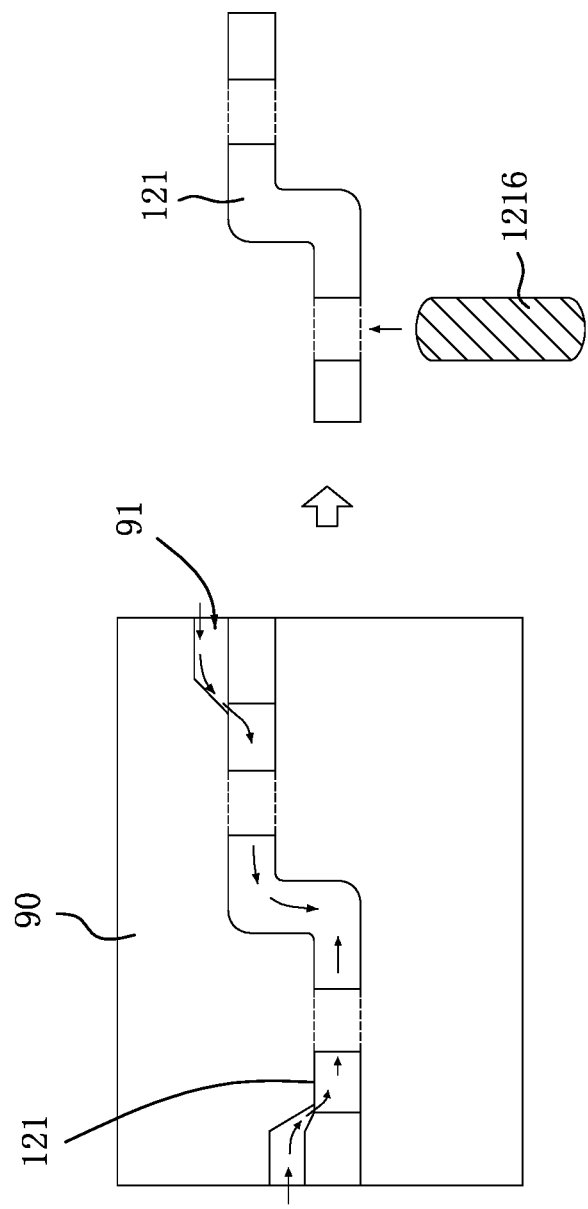
FIG. 36 is a schematic view of state of assembly of the joint structure according to the twenty-seventh embodiment of the present disclosure.

Referring to FIG. 36, as shown in the drawing, in an embodiment of the disclosure, the first joint part 121 (or the second joint part 126) has a fastening part 1216, the fastening part 1216 is made of metallic material, the first joint part 121 is in the mold 90, allowing the liquid plastic material to enter a chamber of the mold from the flow channel 91, after it is cooled down, the first joint part 121 is combined with the fastening part 1216, so that the disclosure can further meet the requirement of practical application.

While the present disclosure has been described by means of specific embodiments, numerous modifications and variations could be made thereto by those skilled in the art without departing from the scope and spirit of the present disclosure set forth in the claims.

What is claimed is:

1. A joint structure, comprising:
  a first object, having a fastening into part and an assembled part located at different positions;
  a body part, having an assembling part to assemble with the assembled part and connect to the first object; and
  an actuating piece, combining movably with the body part, the actuating piece has a first joint part, the first joint part is located outside of the body part, the first joint part can carry out a vertical movement, lateral movement or rotational movement, the first joint part is fastened in the fastening into part of the first object.

2. The joint structure according to claim 1, wherein the body part has an anti-rotation part, the actuating piece has a corresponding anti-rotation part, the anti-rotation part and the corresponding anti-rotation part are anti-rotational mutually, and the corresponding anti-rotation part can be disengaged from the anti-rotation part or can be lifted upwards to disengage from the anti-rotation part, the actuating piece is turned to a bearing part of the body part to make the actuating piece stay or temporarily stay at the bearing part.

3. The joint structure according to claim 1, wherein the joint structure is assembled to a retaining body to make the first joint part fastened into an object, so that a position of the object is limited to the retaining body, or the first joint part is moved upwards to disengage from the object, so that the body is disengaged from the retaining body.

4. The joint structure according to claim 1, wherein the joint structure is assembled to a first object, or the body part is integrally formed with the first object, wherein the first object is a chassis, computer case, case body, motherboard, track, PCB, computer, memory, metallic piece or plastic piece, or the joint structure is assembled to a retaining body to make the first joint part fastened into an object, so that the position of the object is limited to the retaining body, or the first joint part is moved upwards to disengage from the object, and thus the object is disengaged from the retaining body, wherein the retaining body is a chassis, computer case, case body, motherboard, track, PCB, computer, memory, metallic piece or plastic piece.

5. A joint structure, comprising:
  a first object, having a fastening into part and an assembled part located at different positions;
  a body part, having an assembling part to assemble with the assembled part and connect to the first object; and
  an actuating piece, having a first joint part and a rod part, the rod part combines movably inside the body part, so that the actuating piece combines movably with the body part, the first joint part is located outside of the body part, the first joint part can carry out a vertical movement, lateral movement or rotational movement, the first joint part is fastened in the fastening into part of the first object.

6. The joint structure according to claim 5, wherein the actuating piece has a stop part and an elastic element, one end of the elastic element abuts against the body part, and the other end of the elastic element abuts against the stop part.

7. The joint structure according to claim 5, wherein the body part has an anti-rotation part, the actuating piece has a corresponding anti-rotation part, the anti-rotation part and the corresponding anti-rotation part are anti-rotational mutually, and the corresponding anti-rotation part can be disengaged from the anti-rotation part or can be lifted upwards to disengage from the anti-rotation part, the actuating piece is turned to a bearing part of the body part to make the actuating piece stay or temporarily stay at the bearing part.

8. The joint structure according to claim 5, wherein the joint structure is assembled to a retaining body to make the first joint part fastened into an object, so that a position of the object is limited to the retaining body, or the first joint part is moved upwards to disengage from the object, so that the body is disengaged from the retaining body.

9. The joint structure according to claim 5, wherein the joint structure is assembled to a first object, or the body part is integrally formed with the first object, wherein the first object is a chassis, computer case, case body, motherboard, track, PCB, computer, memory, metallic piece or plastic piece, or the joint structure is assembled to a retaining body to make the first joint part fastened into an object, so that the position of the object is limited to the retaining body, or the first joint part is moved upwards to disengage from the object, and thus the object is disengaged from the retaining body, wherein the retaining body is a chassis, computer case, case body, motherboard, track, PCB, computer, memory, metallic piece or plastic piece.

10. A joint structure, comprising:
  a first object, having a fastening into part and an assembled part located at different positions;
  a body part, having an assembling part to assemble with the assembled part and connect to the first object; and
  an actuating piece, having a first joint part, a rod part and a second joint part, the rod part combines movably inside the body part, so that the actuating piece combines movably with the body part, the first joint part is located outside of the body part, the second joint part can carry out a vertical movement, lateral movement or rotational movement, the first joint part is fastened in the fastening into part of the first object.

11. The joint structure according to claim 10, wherein the actuating piece has an elastic element, one end of the elastic element abuts against the body part, and the other end of the elastic element abuts against the second joint part.

12. The joint structure according to claim 10, wherein the body part has an anti-rotation part, the actuating piece has a corresponding anti-rotation part, the anti-rotation part and the corresponding anti-rotation part are anti-rotational mutually, and the corresponding anti-rotation part can be disengaged from the anti-rotation part or can be lifted upwards to disengage from the anti-rotation part, the actuating piece is turned to a bearing part of the body part to make the actuating piece stay or temporarily stay at the bearing part.

13. The joint structure according to claim 10, wherein the joint structure is assembled to a retaining body to make the first joint part or the second joint part fastened into an object, so that a position of the object is limited to the retaining body, or the first joint part or the second joint part is moved upwards to disengage from the object, so that the body is disengaged from the retaining body.

14. The joint structure according to claim 10, wherein the joint structure is assembled to a first object, or the body part is integrally formed with the first object, wherein the first object is a chassis, computer case, case body, motherboard, track, PCB, computer, memory, metallic piece or plastic piece, or the joint structure is assembled to a retaining body to make the first joint part or the second joint part fastened into an object, so that the position of the object is limited to the retaining body, or the first joint part or the second joint part is moved upwards to disengage from the object, and thus the object is disengaged from the retaining body, wherein the retaining body is a chassis, computer case, case body, motherboard, track, PCB, computer, memory, metallic piece or plastic piece.

* * * * *